(12) United States Patent
Terasaki et al.

(10) Patent No.: US 11,698,399 B2
(45) Date of Patent: Jul. 11, 2023

(54) ELECTRIC CONDUCTIVITY-MEASURING MATERIAL, ELECTRIC CONDUCTIVITY-MEASURING FILM, ELECTRIC CONDUCTIVITY-MEASURING DEVICE, AND ELECTRIC CONDUCTIVITY-MEASURING METHOD, AS WELL AS ELECTRIC RESISTIVITY-MEASURING MATERIAL, ELECTRIC RESISTIVITY-MEASURING FILM, ELECTRIC RESISTIVITY-MEASURING DEVICE, AND ELECTRIC RESISTIVITY-MEASURING METHOD

(71) Applicant: NATIONAL INSTITUTE OF ADVANCED INDUSTRIAL SCIENCE AND TECHNOLOGY, Chiyoda-Ku Tokyo (JP)

(72) Inventors: Nao Terasaki, Tosu (JP); Kazuya Kikunaga, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 392 days.

(21) Appl. No.: 16/760,019

(22) PCT Filed: Sep. 14, 2018

(86) PCT No.: PCT/JP2018/034112
§ 371 (c)(1),
(2) Date: Apr. 28, 2020

(87) PCT Pub. No.: WO2019/087589
PCT Pub. Date: May 9, 2019

(65) Prior Publication Data
US 2020/0348238 A1 Nov. 5, 2020

(30) Foreign Application Priority Data
Oct. 30, 2017 (JP) .................................. 2017-209596

(51) Int. Cl.
*G01R 27/02* (2006.01)
*G01N 21/66* (2006.01)
(Continued)

(52) U.S. Cl.
CPC .......... *G01R 27/02* (2013.01); *C09K 11/7734* (2013.01); *G01N 21/66* (2013.01); *G01N 23/2254* (2013.01)

(58) Field of Classification Search
CPC .... G01R 27/02; C09K 11/7734; G01N 21/66; G01N 23/2254
See application file for complete search history.

(56) References Cited

U.S. PATENT DOCUMENTS 4,771,230 A * 9/1988 Zeh .................. G01R 1/072
324/459
5,417,494 A * 5/1995 Kempa .................. G01N 25/72
374/7

(Continued)

FOREIGN PATENT DOCUMENTS

CN 1763311 A 4/2006
DE 102015208151 A1 11/2016
(Continued)

OTHER PUBLICATIONS

Walderhaug, O. et al., "Some Examples of the Effect of Crystallographic Orientation on the Cathodoluminescence Colors of Quartz," Journal of Sedimentary Research, vol. 70, No. 3, May 2000, 6 pages.

(Continued)

*Primary Examiner* — Natalie Huls
*Assistant Examiner* — Sharad Timilsina
(74) *Attorney, Agent, or Firm* — McCoy Russell LLP

(57) ABSTRACT

[Object] An electric conductivity-measuring material which emits light according to electric conductivity of a measure-
(Continued)

ment object; an electric conductivity-measuring film containing the material; and an electric conductivity-measuring device and an electric conductivity-measuring method using the electric conductivity-measuring film are provided. An electric resistivity-measuring material which emits light according to electric resistivity of a measurement object when electrons are made incident; an electric resistivity-measuring film containing the material; and an electric resistivity-measuring device and an electric resistivity-measuring method using the electric resistivity-measuring film are also provided.

[Solution] An electric conductivity-measuring material is used, which contains at least one of a fluorescent substance, a luminescent substance, an electroluminescent substance, a fractoluminescent substance, a photochromic substance, an afterglow substance, a photostimulated luminescent substance and a mechanoluminescent substance.

6 Claims, 18 Drawing Sheets

(51) Int. Cl.
*G01N 23/2254* (2018.01)
*C09K 11/77* (2006.01)

(56) References Cited

U.S. PATENT DOCUMENTS

| 2012/0187368 A1 | 7/2012 | Cao |
| 2013/0207535 A1 | 8/2013 | Hirosaki et al. |

FOREIGN PATENT DOCUMENTS

| GB | 2430441 A | 3/2007 |
| JP | H09281164 A | 10/1997 |
| JP | 2006317318 A | 11/2006 |
| JP | 2008139337 A | 6/2008 |
| JP | 2008157721 A | 7/2008 |
| JP | 2008235373 A | 10/2008 |
| JP | 2009079932 A | 4/2009 |
| JP | 2015219010 A | 12/2015 |
| JP | 2017188648 A | 10/2017 |
| WO | 2017086325 A1 | 5/2017 |

OTHER PUBLICATIONS

Swart, H. et al., "Cathodoluminescence degradation of PLD thin films," Applied Physics A, vol. 101, Jul. 16, 2010, 6 pages.

ISA Japanese Patent Office, International Search Report Issued in Application No. PCT/JP2018/034112, dated Nov. 20, 2018, WIPO, 2 pages.

* cited by examiner

ELECTRIC CONDUCTIVITY-MEASURING MATERIAL, ELECTRIC CONDUCTIVITY-MEASURING FILM, ELECTRIC CONDUCTIVITY-MEASURING DEVICE, AND ELECTRIC CONDUCTIVITY-MEASURING METHOD, AS WELL AS ELECTRIC RESISTIVITY-MEASURING MATERIAL, ELECTRIC RESISTIVITY-MEASURING FILM, ELECTRIC RESISTIVITY-MEASURING DEVICE, AND ELECTRIC RESISTIVITY-MEASURING METHOD

CROSS-REFERENCE TO RELATED APPLICATIONS

The present application is a U.S. National Phase of International Patent Application Serial No. PCT/JP2018/034112 entitled "MATERIAL FOR MEASURING ELECTRICAL CONDUCTIVITY, ELECTRICAL CONDUCTIVITY MEASURING FILM, ELECTRICAL CONDUCTIVITY MEASURING DEVICE, AND ELECTRICAL CONDUCTIVITY MEASURING METHOD, AND MATERIAL FOR MEASURING ELECTRICAL RESISTIVITY, ELECTRICAL RESISTIVITY MEASURING FILM, ELECTRICAL RESISTIVITY MEASURING DEVICE, AND ELECTRICAL RESISTIVITY MEASURING METHOD," filed on Sep. 14, 2018. International Patent Application Serial No. PCT/JP2018/034112 claims priority to Japanese Patent Application No. 2017-209596 filed on Oct. 30, 2017. The entire contents of each of the above-referenced applications are hereby incorporated by reference for all purposes.

TECHNICAL FIELD

The present invention relates to an electric conductivity-measuring material capable of measuring electric conductivity of a surface and inside of an article such as various components, as well as an electric conductivity-measuring film, an electric conductivity-measuring device, and an electric conductivity-measuring method using the material. The present invention also relates to an electric resistivity-measuring material capable of measuring electric resistivity of a surface and inside of an article such as various components, as well as an electric resistivity-measuring film, an electric resistivity-measuring device, and an electric resistivity-measuring method using the material.

BACKGROUND

Electric conductivity (electroconductivity) is one of physical property values representing properties of a substance. Electric conductivity represents the ease with which electricity flows (the reciprocal of electric resistivity) and its value varies from substance to substance. Measuring methods of electric conductivity includes a two-terminal (electrode) measuring method, a four-terminal (electrode) measuring method, and an electromagnetic induction method, for example.

In the two-terminal measuring method, a measurement object is connected to a power source via (two) terminals connected to both ends of the measurement object so that electric conductivity is measured on the basis of voltage applied to the measurement object and current flowing through the measurement object.

On the other hand, in the four-terminal measuring method, a measurement object is connected to a power source via (two) terminals connected to both ends of the measurement object as in the two-terminal measuring method, and further two terminals are provided inward with respect to the former two terminals on the measurement object so that electric conductivity is measured on the basis of potential differences (voltage) between the terminals and current flowing through the measurement object.

In the electromagnetic induction method, the magnitude of induced current generated between two coils sandwiching a solution is measured so as to measure electric conductivity. Note that measuring methods of electric conductivity of electrolyte solutions and water (such as river water, seawater, rainwater, distilled water, and deionized water) are provided in detail in JIS K 0130: 2008, for example.

In addition, an electric conductivity-measuring device has been proposed, the device including: a comparator having a hysteresis characteristic for a threshold of input voltage, and inverted output; a pair of electrodes which come into contact with a measured object, output voltage of the comparator being applied to one of the electrodes; and a capacitor, an end of the capacitor being connected to the other of the electrodes so that the capacitor forms a serial circuit with the measured object and is charged by the output voltage of the comparator via the measured object, wherein an end of the capacitor is connected to an input of the comparator so as to configure an oscillation circuit, and an oscillation period or an oscillation frequency of the oscillation circuit is measured so as to measure electric conductivity of the measured object (see Patent Document 1).

Note that electric resistivity can be measured by the aforementioned measuring methods because electric resistivity is the reciprocal of electric conductivity.

PRIOR ART DOCUMENTS

Patent Documents

Patent Document 1: Japanese Unexamined Patent Application Publication No. 09281164

SUMMARY

Problem to be Solved

However, the aforementioned conventional electric conductivity-measuring device can measure only average electric conductivity (average conductivity across a certain area (volume)) of a measurement object and cannot measure local electric conductivity of the measurement object, which is a problem. In other words, electric conductivity of each portion of the measurement object cannot be measured, which is a problem.

Also, when electric conductivity of a large-sized measurement object is measured by the conventional electric conductivity-measuring methods, extremely high voltage must be applied depending on its material so that electric conductivity cannot be actually measured, which is a problem.

Furthermore, the conventional electric conductivity-measuring methods calculates electric conductivity on the basis of voltage applied to a measurement object and current flowing across the measurement object, and thus electric conductivity cannot be intuitively understood, which is a problem. Note that this is also applied to electric resistivity.

An object of the present invention is to provide: an electric conductivity-measuring material which emits light according to electric conductivity of a measurement object when charged particles such as electrons are made incident or voltage is applied; an electric conductivity-measuring film containing the material; and an electric conductivity-measuring device and an electric conductivity-measuring method using the electric conductivity-measuring film. Another object of the present invention is to provide: an electric resistivity-measuring material which emits light according to electric resistivity of a measurement object when charged particles are made incident or voltage is applied; an electric resistivity-measuring film containing the material; and an electric resistivity-measuring device and an electric resistivity-measuring method using the electric resistivity-measuring film.

Solution to Problem

The inventors of the present invention have found, for the first time in the world, a characteristic that, when charged particles are made incident into a plate-shaped member having a surface on which a film containing a below-described luminescent substance, electroluminescent substance, breaking luminescent substance, photochromic substance, afterglow substance, photostimulated luminescent substance, and mechanoluminescent substance is formed, the film emits light (with different luminance) corresponding to electric conductivity (electroconductivity) of a material forming the plate-shaped member. Then, the inventors has found: a below-described revolutionary electric conductivity-measuring film which makes it possible to show distribution of electric conductivity on a surface or inside of a measurement object by utilizing the aforementioned characteristic; and an electric conductivity-measuring device and an electric conductivity-measuring method using the electric conductivity-measuring film; as well as an electric resistivity-measuring material; an electric resistivity-measuring film containing the electric resistivity-measuring material; and an electric resistivity-measuring device and an electric resistivity-measuring method using the electric resistivity-measuring film.

A first aspect of the present invention consists in an electric conductivity-measuring material containing at least one of a fluorescent substance, a luminescent substance, an electroluminescent substance, a fractoluminescent substance, a photochromic substance, an afterglow substance, a photostimulated luminescent substance and a mechanoluminescent substance.

Herein, the term "fluorescent substance" refers to a substance which emits light by absorbing energy such as X-ray, ultraviolet ray and visible ray with which the substance is irradiated. Examples of the fluorescent substance include: $ZnS:Ag+(Zn, Cd)S:Ag$; $Y_2O_2S:Eu+Fe_2O_3$; $ZnS:Cu, Al$; $ZnS:Ag+CoAl_2O_3$; $Zn_2SiO_4:Mn$; $ZnS:Ag, Cl$; $ZnS:Zn$; $(KF, MgF_2):Mn$; $(Zn, Cd)S:Ag$; $(Zn, Cd)S:Cu$; $ZnO:Zn$; $(Zn, Cd)S:Cu$; $ZnS:Cu$; $ZnS:Cu, Ag$; $MgF_2:Mn$; $(Zn, Mg)F_2:Mn$; $Zn_2SiO_4:Mn$; $ZnS:Ag+(Zn, Cd)S:Cu$; $Gd_2O_2S:Tb$; $Y_2O_2S:Tb$; $Y_2O_2S:Tb$; $Y_3Al_5O_{12}:Ce$; $Y_3(Al, Ga)_5O_{12}:Ce$; $Y_2SiO_5:Ce$; $Y_3Al_5O_{12}:Tb$; $Y_3(Al, Ga)_5O_{12}:Tb$; $ZnS:Ag, Al$; $InBO_3:Tb$; $InBO_3:EU$; $ZnS:Ag$; $ZnS:Cu, Al$; $ZnS:Cu, Au, Al$; $Y_2SiO_5:Tb$; $(Zn, Cd)S:Cu$; $Cl+(Zn, Cd)S:Ag, CL$; $InBO_3:Tb+InBO_3:Eu$; $ZnS:Ag+ZnS:Cu+Y_2O_2S:Eu$; $InBO_3:Tb+InBO_3:Eu+ZnS:Ag$; $(Ba, Eu)Mg_2Al_{16}O_{27}$; $(Ce, Tb)MgAl_{11}O_{19}$; $(Y, Eu)_2O_3$; $(Sr, Eu, Ba, Cf)_5(PO_4)_3CL$; $(La, Ce, Tb)PO_4$; $Y_2O_3:Eu$; $LaPO_4:Ce, Tb$; $(Sr, Cf, Ba)_{10}(PO_4)_6CL_2:Eu$; $(La, Ce, Tb)PO_4:Ce, Tb$; $Zn_2SiO_4:Mn$; $Zn_2SiO_4:Mn$; $Sb_2O_3$; $Ce_{0.67}Tb_{0.33}MgAl_{11}O_{19}:Ce, Tb$; $Y_2O_3:Eu(III)$; $Mg_4(F)GeO_6:Mn$; $Mg_4(F)(Ge, Sn)O_6:Mn$; $CaWO_4$; $CaWO_4:Pb$; $(Ba, Ti)_2P_2O_7:Ti$; $Sr_2P_2O_7:Sn$; $Cf_5F(PO_4)_3:Sb, Mn$; $Sr_5F(PO_4)_3:Sb, Mn$; $BaMgAl_{10}O_{17}:Eu, Mn$; $BaMg_2Al_{16}O_{27}:Eu(II)$; $BaMg_2Al_{16}O_{27}:Eu(II), Mn(II)$; $Sr_5Cl(PO_4)_3:Eu(II)$; $Sr_6P_5BO_{20}:Eu$; $(Cf, Zn, Mg)_3(PO_4)_2:Sn$; $(Sr, Mg)_3(PO_4)_2:Sn$; $CaSiO_3:Pb, Mn$; $Cf_5F(PO_4)_3:Sb, Mn$; $Cf_5(F, Cl)(PO_4)_3:Sb, Mn$; $(Cf, Sr, Ba)_3(PO_4)_2Cl_2:Eu$; $3Sr_3(PO_4)_2SrF_2:Sb, Mn$; $Y(P, V)O_4:Eu$; $(Zn, Sr)_3(PO_4)_2:Mn$; $Y_2O_2S:Eu$; $(Sr, Mg)_3(PO_4)_2:Sn(II)$; $3.5MgO_{0.5}MgF_2GeO_2:Mn$; $Cf_3(PO_4)_2CaF_2:Ce, Mn$; $SrAl_2O_7:Pb$; $BaSi_2O_5:Pb$; $SrFB_2O_3:Eu(II)$; $SrB_4O_7:Eu$; $Gd_2O_2S:Tb$; $Gd_2O_2S:Eu$; $Gd_2O_2S:Pr$; $Gd_2O_2S:Pr, Ce, F$; $Y_2O_2S:Tb$; $Y_2O_2S:Tb$; $Y_2O_2S:Tb$; $Zn(0.5)Cd(0.4)S:Ag$; $Zn(0.4)Cd(0.6)S:Ag$; $CdWO_4$; $CaWO_4$; $MgWO_4$; $Y_2SiO_5:Ce$; $YAlO_3:Ce$; $Y_3Al_5O_{12}:Ce$; $Y_3(Al, Ga)_5O_{12}:Ce$; $CdS$; $ZnO:Ga$; $ZnO:Zn$; $(Zn, Cd)S:Cu, Al$; $ZnO:Zn$; $(Zn, Cd)S:Cu, Al$; $ZnS:Cu, Al$; $ZnCdS:Ag$; $ZnS:Ag$; $Zn_2SiO_4:Mn$; $ZnS:Cu$; $CsI:Tl$; $LiF/ZnS:Ag$; $LiF/ZnS:Cu, Al, Au$; a fluorescein-based fluorescent substance typified by fluorescein isothiocyanate; a porphyrin-based fluorescent substance typified by porphyrin and platinum porphyrin; an organic dye-based fluorescent substance typified by Rhodamine, azobenzene derivatives, and anthracene; metal complex-based fluorescent substance typified by ruthenium tris bipyridyl; luminescent polymer-based fluorescent substance typified by poly (1, 4-phenylenevinylene), poly (1, 4-phenylene), a polyfluorene, and poly(thiophene); other substances such as $Y_2O_2:Eu$; and the like.

In addition, the term "luminescent substance" refers to a substance which is not a fluorescent substance and is capable of emitting light by X-ray, ultraviolet ray, visible light or the like, and a substance capable of emitting light by chemical change or biological enzymes. Specific examples of the luminescent substance include: phosphorescent luminescent materials such as iridium complexes (typified by tris (2-phenylpyridinate) iridium (III)) and platinum complexes; chemiluminescent substances typified by luminol, rofin, lucigenin and oxalate; photosensitive luminescent dye such as 9,10-diphenylanthracene, 9,10-bis (phenylethynyl) anthracene, tetracene, 1-chloro-9,10-bis (phenylethynyl) anthracene, 5,12-bis (phenylethynyl) naphthacene, rubrene, Rhodamine 6G and Rhodamine B; bioluminescent substances typified by luminol; and the like.

The term "electroluminescent substance" refers to a substance that emits light by applying an electric field. Specific examples of the electroluminescent substance include: a low molecular weight substances such as tris (8-quinolinolato) aluminum complex (Alq), bis (benzoquinolinolato) beryllium complex (BeBq), tri (dibenzoylmethyl) phenanthroline europium complex (Eu (DBM) 3 (Phen)), ditoluylvinylbiphenyl (DTVBi) and rubene; π-conjugated polymers such as poly (p-phenylenevinylene) and polyalkylthiophene; and the like.

The term "fractoluminescent substance" refers to a substance that emits light in association with breakage due to mechanical stimulation such as destruction and friction. Specific examples of the fractoluminescent substance include: an inorganic material such as dolomite, muscovite, quartz, trilithionite, pectolite, fluorite and polylithionite; an organic material such as an Eu (TTA) 3 type, a carbazole derivative, an anthranilic acid type and a sugar; and the like.

The term "photochromic substance" refers to a substance which shows change in physical characteristics such as color by irradiation with X-ray, ultraviolet ray or visible ray. Specific examples of the photochromic substance include: an organic pigment typified by a spiropyran type, a diarylethene type and a fulgide type; an inorganic material typified by barium magnesium silicate ($BaMgSiO_4$); and the like.

The term "afterglow substance" refers to a substance which accumulates lights (electromagnetic waves) of visible ray, ultraviolet ray and the like with which the substance is irradiated, and emits the lights even when the irradiation is stopped. Specific examples of the afterglow substance include a radium compound, a promethium compound, a zinc sulfide (ZnS type), a strontium aluminate ($SrAl_2O_4$ type) and the like, and a zinc sulfide (ZnS type) and a strontium aluminate ($SrAl_2O_4$ type) to which monovalent to trivalent metal ions such as Dy and Eu are added in an arbitrary proportion are preferable. Herein, the term "add" refers to a concept that includes "co-doping", which means simultaneous addition of two or more substances, and "activation".

The term "photostimulated luminescent substance" refers to a substance which emits light by excitation of visible or infrared ray after irradiation with a high-energy laser, radiation or the like. Specific examples of the photostimulated luminescent substance include $BaFX:Eu^{2+}$ (X represents Br or I) and the like.

The term "mechanoluminescent substance" refers to a substance which emits light (including visible ray, ultraviolet ray, near-infrared ray) through deformation caused by a mechanical external force. Examples of the mechanoluminescent substance include: a substance mainly composed of an oxide, a sulfate, a selenide or a telluride which has a spinel structure, a corundum structure, a β-alumina structure, a silicate, a defect-controlling aluminate and a structure with coexistence of a wurtzite type structure and a sphalerite type structure, and the like; and a substance in which at least a part of alkali metal ions and alkali earth metal ions constituting the above-described structure is substituted by at least one metal ion of rare earth metal ions and transition metal ions; and the like.

The mechanoluminescent substances are classified into an alumina type, a silica type, a phosphoric acid type, a titanium oxide type, a zinc sulfide type and others.

Specific examples of the alumina type include: $xSrO.yAl_2O_3.zMO$ (M represents a divalent metal Mg, Ca or Ba; each of x, y and z represents an integer. Note that M is not limited as long as it is a divalent metal, but Mg, Ca and Ba are preferable. In addition, x, y and z represents an integer equal to or larger than 1.); $Al_2O_3:Tb^{3+}$; $SrAl_2O_4:M$ (doped with M=at least one of $Eu^{2+}$, $Dy^{3+}$, $Ce^{3+}$ and $Ho^{3+}$); $ZnAl_2O_4:M$ (doped with M=at least one of $Eu^{2+}$, $Mn^{2+}$, $Dy^{3+}$, $Ce^{3+}$ and $Ho^{3+}$); $SrAl_2O_4:Eu^{2+}$; $SrAl_2O_4:Ce^{3+}$; $SrAl_2O_4:Eu^{2+},Dy^{3+}$; $SrAl_2O_4:Eu^{2+},Ho^{3+}$; $SrAl_2O_4:Ho^{3+}$, $Ce^{3+}$; $XAl_2O_4:M$ (doped with X=one or two of Sr, Ba, Mg, Ca and Zn, and doped with M=at least one of $Eu^{2+}$, $Dy^{3+}$, $Tb^{3+}$, $Ho^{3+}$); $SrAl_2O_4:Eu^{2+},Cr^{3+},Nd^{3+}$; and the like.

Other specific examples of the alumina type include: general formula $Sr\{1-(2x+3y+3z)/2\}Al_2O_4:xEu^{2+}$, $yCr^{3+}$, $zNd^{3+}$ (here, each of x, y and z represents 0.25 to 10 mol %, preferably 0.5 to 2 mol %); $Sr_3Al_2O_6:Eu^{2+}$; $CaYAl_3O_7:Eu^{2+}$; $CaYAl_3O_7:M$ (doped with M=at least one of $Eu^{2+}$, $Ce^{3+}$, $Dy^{3+}$, $Ce^{3+}$ and $Ho^{3+}$); $SrMgAl_{10}O_{17}:Ce^{3+}$; and the like.

Specific examples of the silica type include: $xSrO.yAl_2O_3.zSiO_2$ (each of x, y and z represents an integer); $Ca_2Al_2Si_2O_7:Ce^{3+}$; $X_2Al_2SiO_7:M$ (doped with X=one of Ca and Sr, and doped with M=at least one of $Eu^{2+}$, $Eu^{3+}$, $Ce^{3+}$ and $Dy^{3+}$); $Ca_2MgSi_2O_7$; $Ce^{3+}$; $X_2MgSi_2O_7:M$ (doped with X=one of Ba, Ca and Sr or $X_2$=one of SrCa and SrBa, and doped with M=at least one of $Eu^{2+}$, $Dy^{3+}$ and $Ce^{3+}$); $CaAl_2Si_2O_8:Eu^{2+}$, $SrCaAl_2Si_2O_8:Eu^{2+}$; $Ca_3Y_2Si_3O_{12}:RE^{3+}$ (doped with $RE^{3+}$=at least one of $Dy^{3+}$ and $Eu^{2+}$); $BaSi_2O_2N_2:Eu^{2+}$; and the like.

Specific examples of the phosphoric acid type include: $Li_3PO_4:RE$ (RE=$Dy^{3+}$, $Tb^{3+}$, $Ce^{3+}$ or $Eu^{2+}$); $LiXPO_4:Eu^{2+}$ (X=one of Sr and Br); $Li_2BaP_2O_7:Eu^{2+}$; $CaZr(PO_4)_2:Eu^{2+}$; and the like. Specific examples of the titanium oxide type include: $CaTiO_3:Pr^{3+}$; $BaCaTiO_3:Pr^{3+}$; $BaTiO_3$—$CaTiO_3$: $Pr^{3+}$; and the like.

Specific examples of the zinc sulfide type include: ZnS:M (M is not limited as long as it is bivalent metal, but is preferably Mn, Ga, Cu or the like; doped with M=at least one of $Mn^{2+}$, $Ga^{2+}$, $Te^{2+}$, $Cu^{2+}$, CuCl, Al); XZnOS:M (doped with X=one of Ca and Ba, and M=one of $Mn^{2+}$ and $Cu^{2+}$); ZnMnTe; and the like.

Other specific examples of mechanoluminescent substance include: $CaZrO_3:Eu^{3+}$; $CaNb_2O_n:Pr^{3+}$ (n=6 or 7); (Sr, Ca, Ba)(2)$SnO_4:Sm^{3+},La^{3+}$; $Sr_{n+1}Sn_nO_{3n+1}:Sm^{3+}$ (n=1, 2 or more); $Y_2O_3:Eu^{2+}$; $ZrO_2:Ti$; $XGa_2O_4:Mn^{2+}$ (X=either one of Zr and Mg); and the like.

Each of the "fluorescent substance", "luminescent substance", "electroluminescent substance", "fractoluminescent substance", "photochromic substance", "afterglow substance", "photostimulated luminescent substance" and "mechanoluminescent substance" may have not only the property of each substance itself but also the properties of other substances. For example, the "mechanoluminescent substance" may have the property of the "fluorescent substance".

Also, the electric conductivity-measuring material may contain substances other than the above-mentioned substances. Note that the substances other than the above-mentioned substances are not particularly limited.

The electric conductivity-measuring material according to the first aspect varies its intensity (luminance) or speed of light emission depending on electric conductivity of a substance in the vicinity thereof when irradiated with charged particles, and therefore it is possible to visually and easily measure the electric conductivity of the substance. The term "charged particle" herein refers to a particle, a cluster, a gas and the like having electric charge. Examples of the charged particle include an electron, a proton, an ionized atom (including a nucleus itself), an ionized molecule (including a complex), an electrolytically-dissociated/ionized gas, and the like.

Also, a certain portion emits light first when irradiated with the charged particles, and then, portions around the certain portion begin to emit light and luminance of the certain portion that has emitted light first is gradually lowered with the lapse of time. Such a phenomenon occurs repeatedly, so that it looks as if the light is moving (being propagated). The moving speed (propagation speed) of the portion that emits light (light-emitting portion) is increased according to electric conductivity of a part and its surroundings on a surface of the measurement object 10 in contact with the light-emitting portion.

Therefore, electric conductivity (electric conductivity distribution) of a surface or inside of the measurement object 10 corresponding to the light-emitting portion can be easily measured by measuring the moving speed of the light-emitting portion.

A second aspect of the present invention consists in the electric conductivity-measuring material according to the first aspect, a weight ratio of the fluorescent substance, the luminescent substance, the electroluminescent substance, the fractoluminescent substance, the photochromic substance, the afterglow substance, the photostimulated luminescent substance, and the mechanoluminescent substance being 20 to 80 wt %.

The electric conductivity-measuring material according to the second aspect can emit light with sufficient luminance to be detected by a general industrial camera or the like, and therefore it is possible to more easily detect the electric conductivity of the substance in the vicinity of the electric conductivity-measuring material.

A third aspect of the present invention consists in the electric conductivity-measuring material according to the first or second aspect, the mechanoluminescent substance being: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

The electric conductivity-measuring material according to the third aspect can emit light with greater luminance, and therefore it is possible to more easily detect the electric conductivity of the substance in the vicinity of the electric conductivity-measuring material.

A fourth aspect of the present invention consists in an electric conductivity-measuring film provided on a surface of a measurement object and containing the electric conductivity-measuring material according to any one of the first to third aspects.

Herein, the "electric conductivity-measuring film" is not particularly limited as long as it is composed of a material containing at least one of the above-described substances. The electric conductivity-measuring flm may be prepared by homogenously mixing e.g. an epoxy resin or a urethane resin, a curing agent and a solvent for controlling crosslinking/curing reaction of these resins, the above-described substance, and a dispersant/adjuvant for homogenously dispersing the substance. The concentration (weight ratio) of the above-described substance contained in the electric conductivity-measuring flm is not particularly limited, but a range of 20 to 80 wt % is preferable because light emission can be visually confirmed, and a range of 50 to 70 wt % is more preferable because light emission can be visually confirmed more obviously. Note that, the "electric conductivity-measuring film" may be directly formed (solution application/curing) on the surface of the measurement object, or alternatively a preformed "electric conductivity-measuring film" may be stuck to the surface of the measurement object to form the film on the surface of the measurement object.

In the fourth aspect, the electric conductivity-measuring film can emit light with luminosity depending on electric conductivity of the surface or inside of the measurement object, and therefore the electric conductivity (distribution) on the surface or inside of the measurement object can be intuitively understood. In addition, the electric conductivity-measuring film can be easily formed and stuck to the measurement object without being influenced by the shape of the measurement object. As a result, even if the measurement object has a complicated three-dimensional shape such as a curved face, electric conductivity (distribution) of the surface or inside thereof can be easily visualized.

A fifth aspect of the present invention consists in the electric conductivity-measuring film according to the fourth aspect, volume resistivity or surface resistivity of the electric conductivity-measuring film being higher than volume resistivity or surface resistivity of the measurement object.

Herein, the term "volume resistivity" refers to a resistance value per unit volume, and the term "surface resistivity" refers to a resistance value per unit area.

In the fifth aspect, the volume resistivity or surface resistivity of the electric conductivity-measuring film is higher than the volume resistivity or surface resistivity of the measurement object, so that charge of the charged particles (such as electrons) incident into the electric conductivity-measuring film quickly moves into the measurement object. As a result, light emission intensity of the electric conductivity-measuring film increases, and therefore the electric conductivity (distribution) of the surface or inside of the measurement object can be more easily visualized.

A sixth aspect of the present invention consists in the electric conductivity-measuring film according to the fourth or fifth aspect, a thickness of the film being in a range from 1 μm to 1 mm.

The electric conductivity-measuring film according to the sixth aspect can emit light with sufficient luminance without the electric conductivity-measuring film affecting the electric conductivity of the measurement object. As a result, the electric conductivity (distribution) of the surface or inside of the measurement object can be more easily visualized.

A seventh aspect of the present invention consists in an electric conductivity-measuring device for measuring electric conductivity of a surface or inside of a measurement object, including: the electric conductivity-measuring film according to any one of the fourth to sixth aspects provided on the surface of the measurement object; and a charged particle-emitting unit which is provided in a direction facing the electric conductivity-measuring film and emits charged particles toward the electric conductivity-measuring film.

In the seventh aspect, the electric conductivity (distribution) of the surface or inside of the measurement object can be easily measured.

An eighth aspect of the present invention consists in an electric conductivity-measuring device for measuring electric conductivity of a surface or inside of a measurement object, including: the electric conductivity-measuring film according to any one of the fourth to sixth aspects provided on the surface of the measurement object; and a voltage application means which applies voltage to the measurement object.

In the eighth aspect, the electric conductivity (distribution) of the surface or inside of the measurement object can be easily measured.

A ninth aspect of the present invention consists in an electric conductivity-measuring method for measuring electric conductivity of a surface or inside of a measurement object, including steps of: forming the electric conductivity-measuring film according to any one of the fourth to sixth aspects on the surface of the measurement object; and emitting charged particles toward the electric conductivity-measuring film.

In the ninth aspect, the electric conductivity (distribution) of the surface or inside of the measurement object can be easily measured.

A tenth aspect of the present invention consists in an electric conductivity-measuring method for measuring electric conductivity of a surface or inside of a measurement object, including steps of: forming the electric conductivity-measuring film according to any one of the fourth to sixth aspects on the surface of the measurement object; and applying voltage to the measurement object.

In the tenth aspect, the electric conductivity (distribution) of the surface or inside of the measurement object can be easily measured.

An eleventh aspect of the present invention consists in an electric resistivity-measuring material containing at least one of a fluorescent substance, a luminescent substance, an electroluminescent substance, a fractoluminescent substance, a photochromic substance, an afterglow substance, a photostimulated luminescent substance and a mechanoluminescent substance. Similar to the electric conductivity-measuring material, the electric resistivity-measuring material may contain substances other than the above-mentioned substances. Note that the substances other than the above-mentioned substances are not particularly limited.

The electric resistivity-measuring material according to the eleventh aspect varies its intensity (luminance) or speed of light emission depending on electric resistivity of a substance in the vicinity thereof when charged particles are incident, and therefore it is possible to visually and easily measure the electric resistivity (distribution) of the substance.

A twelfth aspect of the present invention consists in the electric resistivity-measuring material according to the eleventh aspect, a weight ratio of the fluorescent substance, the luminescent substance, the electroluminescent substance, the fractoluminescent substance, the photochromic substance, the afterglow substance, the photostimulated luminescent substance, and the mechanoluminescent substance being 20 to 80 wt %.

The electric resistivity-measuring material according to the twelfth aspect can emit light with sufficient luminance to be detected by a general industrial camera or the like, and therefore it is possible to more easily detect the electric resistivity (distribution) of the substance in the vicinity of the electric resistivity-measuring material.

A thirteenth aspect of the present invention consists in the electric resistivity-measuring material according to the eleventh or twelfth aspect, mechanoluminescent substance being: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

The electric resistivity-measuring material according to the thirteenth aspect can emit light with greater luminance, and therefore it is possible to more easily detect the electric resistivity (distribution) of the substance in the vicinity of the electric resistivity-measuring material.

A fourteenth aspect of the present invention consists in an electric resistivity-measuring film provided on a surface of a measurement object and containing the electric resistivity-measuring material according to any one of the eleventh to thirteenth aspects.

Herein, the "electric resistivity-measuring film" is not particularly limited as long as it is composed of a material containing at least one of the above-described substances. The electric resistivity-measuring film may be prepared by homogenously mixing e.g. an epoxy resin or a urethane resin, a curing agent and a solvent for controlling crosslinking/curing reaction of these resins, the above-described substance, and a dispersant/adjuvant for homogenously dispersing the substance. The concentration (weight ratio) of the above-described substance contained in the electric resistivity-measuring film is not particularly limited, but a range of 20 to 80 wt % is preferable because light emission can be visually confirmed, and a range of 50 to 70 wt % is more preferable because light emission can be visually confirmed more obviously. Note that, the "electric resistivity-measuring film" may be directly formed (solution application/curing) on the surface of the measurement object, or alternatively a preformed "electric resistivity-measuring film" may be stuck to the surface of the measurement object to form the film on the surface of the measurement object.

In the fourteenth aspect, the electric resistivity-measuring film can emit light with luminosity depending on electric resistivity of the surface or inside of the measurement object, and therefore the electric resistivity (distribution) on the surface or inside of the measurement object can be intuitively understood. In addition, the electric resistivity-measuring film can be easily formed and stuck to the measurement object without being influenced by the shape of the measurement object. As a result, even if the measurement object has a complicated three-dimensional shape such as a curved face, electric resistivity (distribution) of the surface or inside thereof can be easily visualized.

A fifteenth aspect of the present invention consists in the electric resistivity-measuring film according to the fourteenth aspect, volume resistivity or surface resistivity of the electric resistivity-measuring film being higher than volume resistivity or surface resistivity of the measurement object.

In the fifteenth aspect, the volume resistivity or surface resistivity of the electric resistivity-measuring film is higher than the volume resistivity or surface resistivity of the measurement object, so that charge of the charged particles (such as electrons) incident into the electric resistivity-measuring film quickly moves into the measurement object. As a result, light emission intensity of the electric resistivity-measuring film increases, and therefore the electric resistivity (distribution) of the surface or inside of the measurement object can be more easily visualized.

A sixteenth aspect of the present invention consists in the electric resistivity-measuring film according to the fourteenth or fifteenth aspect, a thickness of the film being in a range from 1 μm to 1 mm.

The electric resistivity-measuring film according to the sixteenth aspect can emit light with sufficient luminance without the electric resistivity-measuring film affecting the electric resistivity of the measurement object. As a result, the electric resistivity (distribution) of the surface or inside of the measurement object can be more easily visualized.

A seventeenth aspect of the present invention consists in an electric resistivity-measuring device for measuring electric resistivity of a surface or inside of a measurement object, the device including: the electric resistivity-measuring film according to any one of the fourteenth to sixteenth aspects provided on the surface of the measurement object; and a charged particle-emitting unit which is provided in a direction facing the electric resistivity-measuring film and emits charged particles toward the electric resistivity-measuring film.

In the seventeenth aspect, the electric resistivity (distribution) of the surface or inside of the measurement object can be easily measured.

An eighteenth aspect of the present invention consists in an electric resistivity-measuring device for measuring electric resistivity of a surface or inside of a measurement object, including: the electric resistivity-measuring film according to any one of the fourteenth to sixteenth aspects provided on the surface of the measurement object; and a voltage application means which applies voltage to the measurement object.

In the eighteenth aspect, the electric resistivity (distribution) of the surface or inside of the measurement object can be easily measured.

A nineteenth aspect of the present invention consists in an electric resistivity-measuring method for measuring electric resistivity of a surface or inside of a measurement object, including steps of: forming the electric resistivity-measuring film according to any one of the fourteenth to sixteenth aspects on the surface of the measurement object; and emitting charged particles toward the electric resistivity-measuring film.

In the nineteenth aspect, the electric resistivity (distribution) of the surface or inside of the measurement object can be easily measured.

A twentieth aspect of the present invention consists in an electric resistivity-measuring method for measuring electric resistivity of a surface or inside of a measurement object, including steps of: forming the electric resistivity-measuring film according to any one of the fourteenth to sixteenth aspects on the surface of the measurement object; and applying voltage to the measurement object.

In the twentieth aspect, the electric resistivity (distribution) of the surface or inside of the measurement object can be easily measured.

DESCRIPTION OF EMBODIMENTS

Embodiments of an electric conductivity-measuring material, an electric conductivity-measuring film using the material, and an electric conductivity-measuring device using the electric conductivity-measuring film according to the present invention will be explained below with reference to the accompanying drawings. Note that the present invention is not limited to the following embodiments.

Embodiment 1

Figure 1:
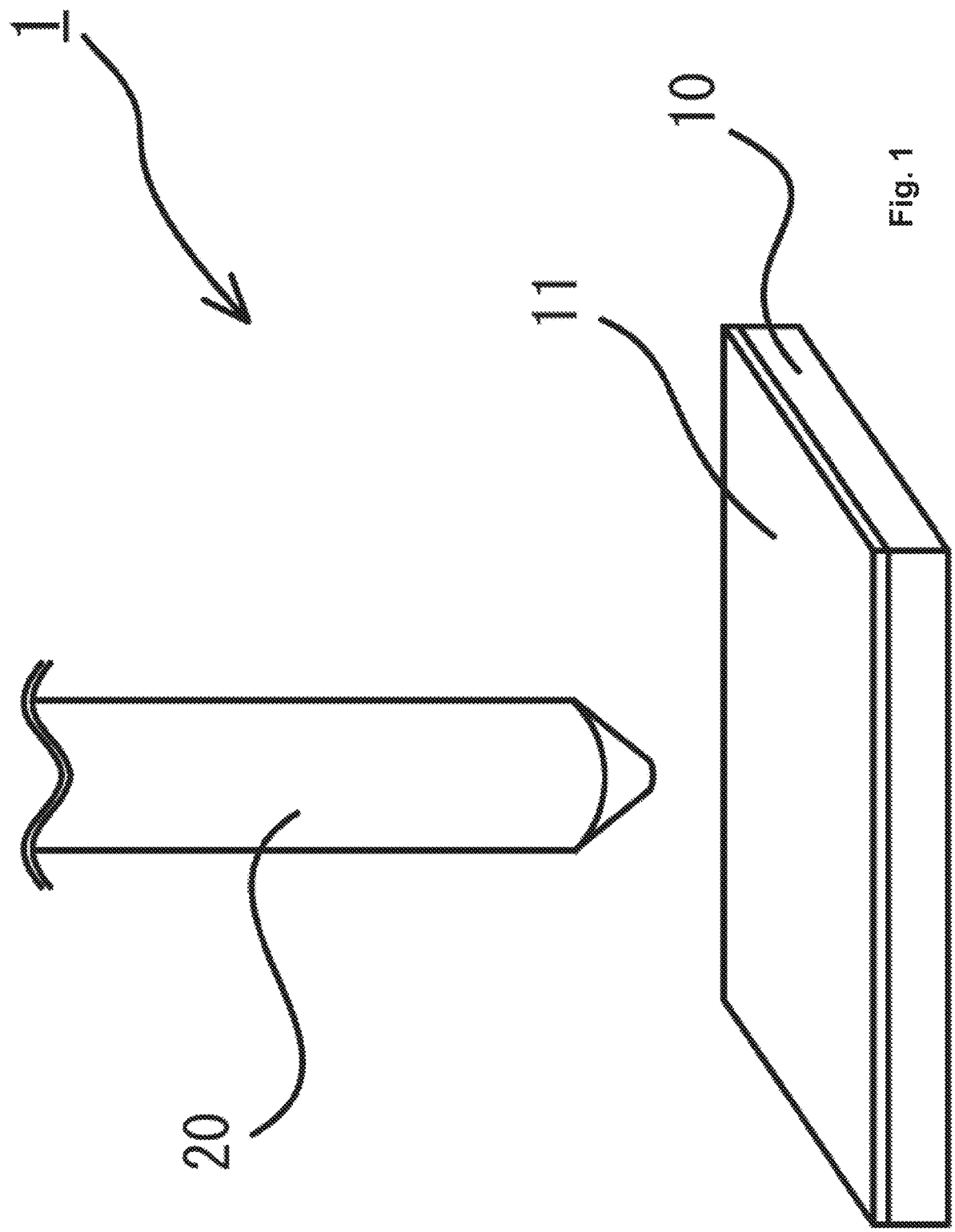
FIG. 1 is a schematic perspective view of an electric conductivity-measuring device according to Embodiment 1.

FIG. 1 illustrates a schematic perspective view of an electric conductivity-measuring device according to Embodiment 1. As illustrated in this figure, in an electric conductivity-measuring device 1 according to Embodiment 1, an electric conductivity-measuring film 11 is formed throughout a surface of a rectangular flat measurement object 10, the electric conductivity-measuring film 11 containing at least one of an fluorescent substance, a luminescent substance, an electroluminescent substance, a breaking luminescent substance, a photochromic substance, an afterglow substance, a photostimulated luminescent substance, and a mechanoluminescent substance.

In addition, cylindrical charged particle-emitting unit 20 having a taper-shaped tip portion is fixed above the electric conductivity-measuring film 11 by a jig (not shown) so that the electric conductivity-measuring film 11 can be irradiated with charged particles. Specifically, when an electric field (or voltage) is applied between a charged particle-emitting unit and the measurement object 10, charged particles (e.g., $N^+$, $N^-$, $O^{2-}$, $H^+$, electrons, or the like) generated by ionization of gases present in the vicinity of the charged particle-emitting unit are emitted toward the electric conductivity-measuring film 11.

Furthermore, a camera (not shown) as a recording unit for recording a luminescence state of the electric conductivity-measuring film 11 is fixed above the measurement object 10 with a jig (not shown) so that the luminescence state of the electric conductivity-measuring film 11 can be recorded.

Herein, the electric conductivity-measuring film 11 is not particularly limited as long as it is composed of a material containing at least one type of the aforementioned substances. A thickness of the electric conductivity-measuring film 11 is not particularly limited, but the thickness is preferably within a range of 1 µm to 1 mm, more preferably a range of 10 µm to 500 µm from the viewpoint of luminance and handling ease.

The electric conductivity-measuring film 11 may include, for example: a film manufactured by homogeneously mixing an epoxy resin or an urethane resin, a curing agent and a solvent for controlling crosslinking/curing reaction of these resins, the above-described substances, and a dispersant/auxiliary agent for homogeneously dispersing the substances, and applying/curing this mixture on the surface of the measurement object 10; and non-woven fabric, paper, or other cloth-like members composed of polyester, nylon, acryl, cellulose or the like in which the above-described substances are dispersed. The electric conductivity-measuring film manufactured as above may be directly formed on a surface of the measurement object, or the separately manufactured electric conductivity-measuring film 11 may be attached to the surface of the measurement object.

Note that the concentration (total weight ratio) of the above-described substances contained in the electric conductivity-measuring film 11 is not particularly limited, but a range of 20 wt % to 80 wt % is preferable because light emission can be visually confirmed, and a range of 50 wt % to 70 wt % is more preferable because light emission can be visually confirmed more obviously.

In addition, the charged particle-emitting unit 20 is not particularly limited as long as it can emit the charged particle, but preferably, it can emit the charged particle having an energy ranging from 1 V/mm to 3000 V/mm, and particularly preferably, it can emit the charged particle having an energy ranging from 22 V/mm to 1000V/mm.

Figure 2:
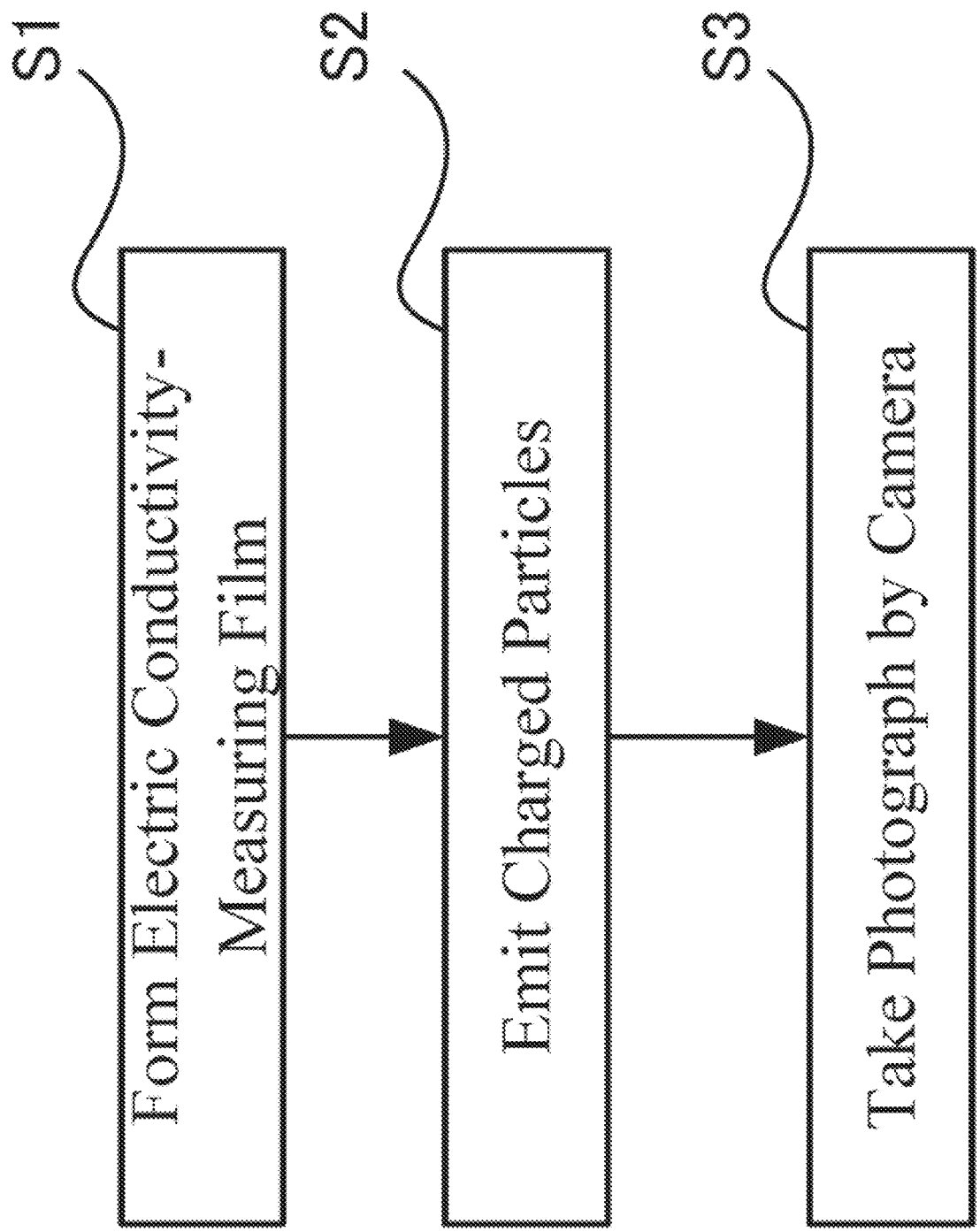
FIG. 2 is an operation flowchart of the electric conductivity-measuring device according to Embodiment 1.

Next, an operation of the electric conductivity-measuring device 1 (electric conductivity-measuring method) according to Embodiment 1 will be explained. FIG. 2 is an operation flowchart of the electric conductivity-measuring device according to Embodiment 1.

First, the electric conductivity-measuring film 11 is formed on the surface of the measurement object 10 (S1). Then, charged particles are emitted from a charged particle-emitting unit 20 (S2).

Then, the electric conductivity-measuring film 11 emits light according to electric conductivity of a surface or inside of the measurement object 10 in contact with the film 11. That is, the electric conductivity-measuring film 11 emits light corresponding to electric conductivity distribution of the surface or inside of the measurement object 10. Also, luminance of the electric conductivity-measuring film 11 which emits light at this time is increased according to the magnitude of the electric conductivity of the measurement object 10 corresponding to a portion which emits light. Furthermore, the speed of the light emission of the electric conductivity-measuring film 11 is also increased according to the magnitude of the electric conductivity of the measurement object 10 corresponding to a portion that emits light. In addition, the moving speed (propagation speed) of the portion that emits light is increased according to the magnitude of the electric conductivity of the measurement object 10 corresponding to the portion that emits light.

Then, the luminescence state is photographed by a camera disposed above the measurement object 10 (S3).

Note that the electric conductivity of the measurement object 10 can be calculated on the basis of the light-emission (luminance) data of the electric conductivity-measuring film 11 obtained as above. Specifically, calibration curves of the luminance and the electric conductivity of electric conductivity-measuring film 11 are prepared in advance, for example. The, electric conductivity (electric conductivity distribution) of each portion (area) of the surface of the measurement object can be calculated from these calibration curves and the luminance.

As described above, local electric conductivity (electric conductivity distribution) of the measurement object 10 can be measured by the electric conductivity-measuring method and the electric conductivity-measuring device 1 according to this embodiment.

Also, the electric conductivity-measuring method and the electric conductivity-measuring device 1 according to this embodiment do not require the direct application of voltage to the measurement object 10, so that the electric conductivity can be measured regardless of the size, shape, and the like of the measurement object.

Furthermore, in the electric conductivity-measuring method and the electric conductivity-measuring device 1 according to this embodiment, the magnitude of the luminance of the electric conductivity-measuring film 11 represents the magnitude of the electric conductivity. Therefore, the electric conductivity (electric conductivity distribution) of the measurement object 10 can be intuitively understood, which cannot be achieved by the conventional measuring methods.

Also, measurement object 10 is irradiated with the charged particles, a portion of the electric conductivity-measuring film 11 located just below the charged particle-emitting unit 20 emits light first, and then, portions around the certain portion begin to emit light and luminance of the certain portion that has emitted light first is gradually lowered with the lapse of time. Such a phenomenon occurs repeatedly, so that it looks as if the light is moving (being propagated) as a ring of light is spreading. The moving speed (propagation speed) of the light-emitting portion is increased according to electric conductivity of a part and its surroundings on the surface or inside of the measurement object 10 in contact with the light-emitting portion.

Therefore, calibration curves of the moving speed and electric conductivity of the light-emitting portion are prepared in advance, and the electric conductivity (electric conductivity distribution) of the surface of the measurement object 10 corresponding to the light-emitting portion can be calculated from these calibration curves and the moving speed of the light-emitting portion that have been actually measured.

Note that, although the electric conductivity-measuring device 1 is configured using one charged particle-emitting unit 20 in this embodiment, the present invention is not limited thereto. The electric conductivity-measuring device including a plurality of the charged particle-emitting units may be configured so as to uniformly irradiate the electric conductivity-measuring film 11 formed on the measurement object 10 with the charged particles. This configuration allows the electric conductivity-measuring film 11 to be uniformly irradiated with the charged particles so that the electric conductivity (electric conductivity distribution) of the measurement object 10 can be measured with higher accuracy.

Note that the electric conductivity is the reciprocal of the electric resistivity. Therefore, when the electric conductivity-measuring film 11 of this embodiment is replaced by an electric resistivity-measuring film, electric resistivity (electric resistivity distribution) of the measurement object 10 can also be measured in a similar manner to the electric conductivity (electric conductivity distribution).

Example 1

Figure 3:
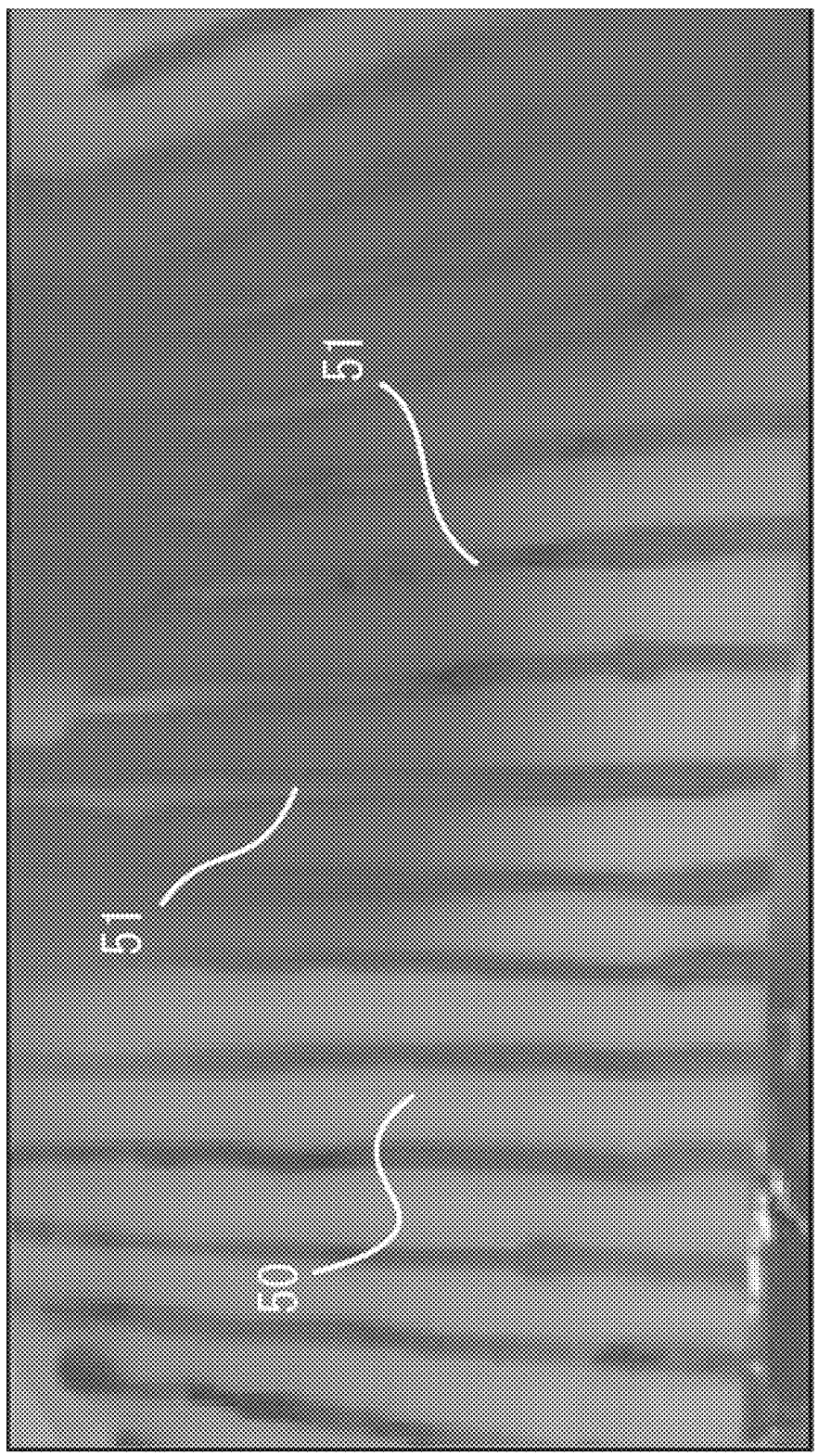
FIG. 3 is a photograph of a surface of a polylactic acid sheet (measurement object) of Example 1 on which a plurality of silver nanoink lines are formed.

As shown in FIG. 3, a plurality of silver nanoink lines were formed on a polylactic acid sheet (PLA sheet) by using silver ink (DGP-NO, from Advanced Nano Products Co., Ltd). Then, a PLA sheet 50 on which the silver nanoink lines 51 were formed in a stripe shape was made as a measurement object.

Figure 4:
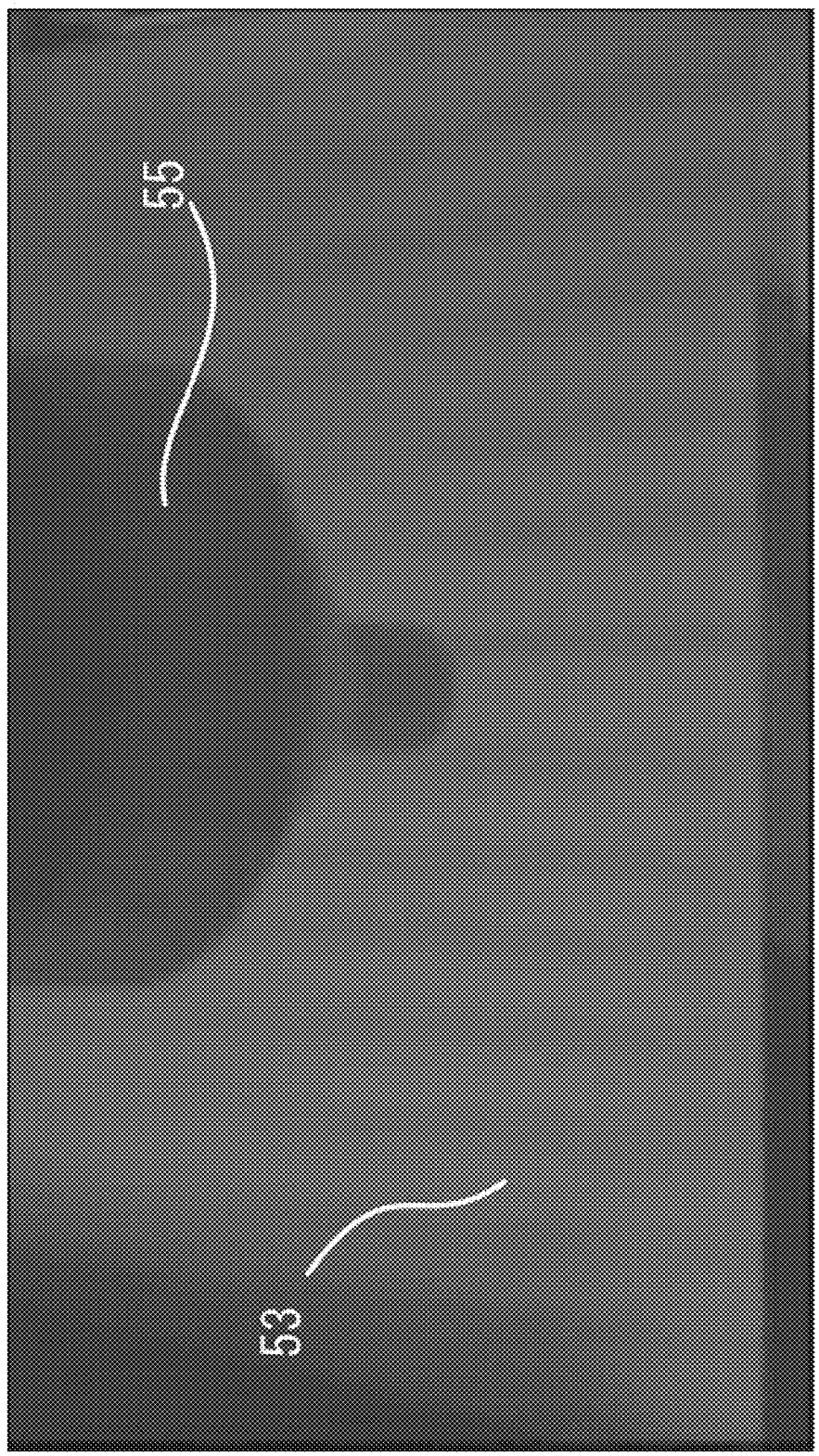
FIG. 4 is a photograph in which an electric conductivity-measuring sheet is placed on the measurement object of Example 1.

Then, an electric conductivity-measuring film, i.e., nonwoven fabric (electric conductivity-measuring sheet 53) into which $SrAl_2O_4:Eu^{2+}$ was kneaded was placed on this PLA sheet 50. Next, as shown in FIG. 4, an electrode 55 as a charged particle-emitting unit was placed above the nonwoven fabric (distance: 10 mm).

Figure 5:
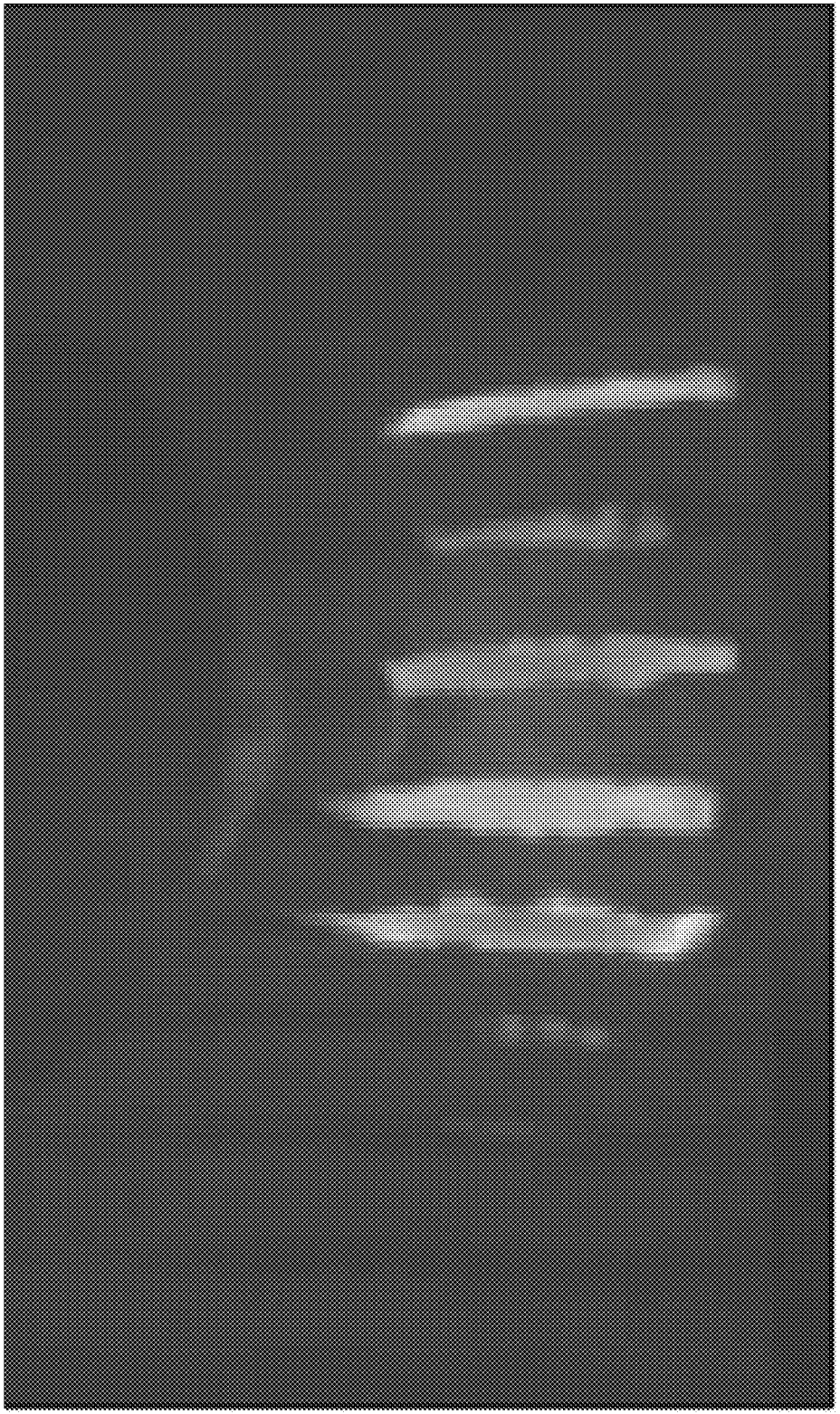
FIG. 5 is a photograph in which the measurement object of Example 1 is irradiated with charged particles.

Thereafter, the measurement object was irradiated with charged particle by applying DC voltage of 3 kV and 1 μA to the electrode 55 to cause corona discharge, the result being shown in FIG. 5. Here, electric conductivity of the PLA sheet is $1.00 \times 10^{-15}$ $\Omega^{-1} \cdot m^{-1}$ or more, and electric conductivity of the silver nanoink lines is $1.68 \times 10^{-2}$ $\Omega^{-1} \cdot m^{-1}$.

As shown in FIG. 5, it was found that portions consisting of the silver nanoink lines having higher electric conductivity had higher luminance than portions consisting of polylactic acid. That is, it was found that, by irradiating the electric conductivity-measuring film with the charged particles to cause light emission, portions in the measurement object where electricity flowed relatively easily could be measured, and furthermore, relative electric conductivity distribution of the measurement object could be measured using calibration curves and the like.

Example 2

Figure 6:
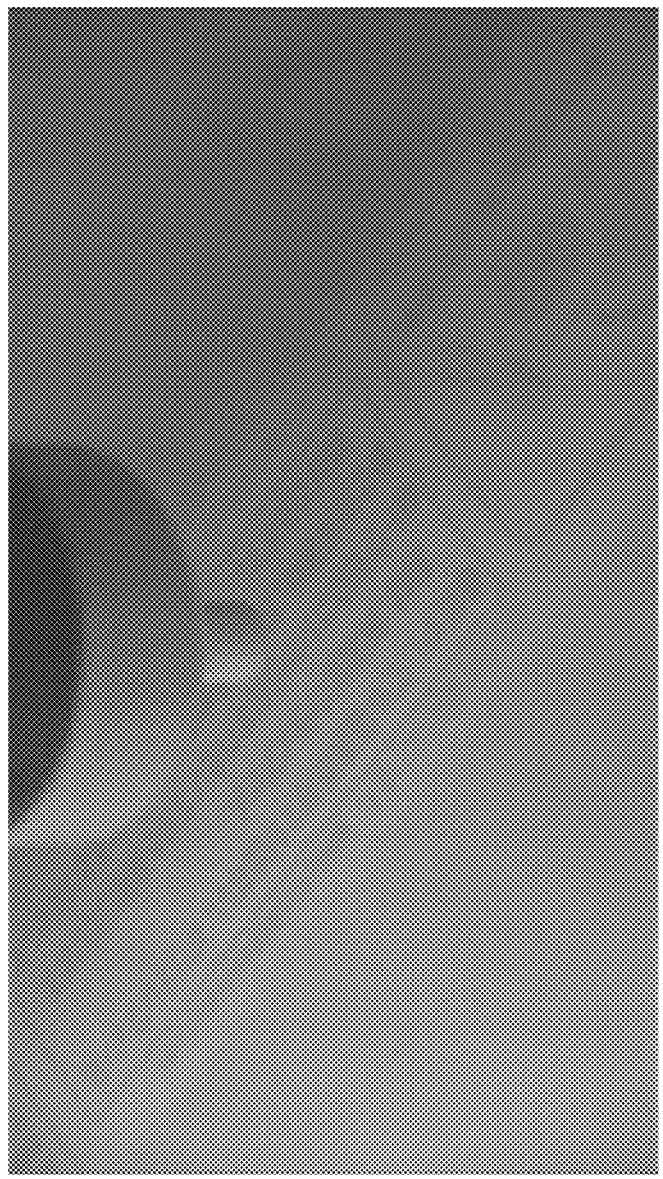
FIG. 6 is a photograph in which an electric conductivity-measuring sheet is placed on a measurement object of Example 2.

As shown in FIG. 6, an electric conductivity-measuring film, i.e., non-woven fabric (electric conductivity-measuring sheet) into which $SrAl_2O_4:Eu^{2+}$ was kneaded was placed on a packaging box (measurement object) with characters and the like printed on it. Here, portions with characters printed have higher electric conductivity than portions without characters printed.

Figure 7:
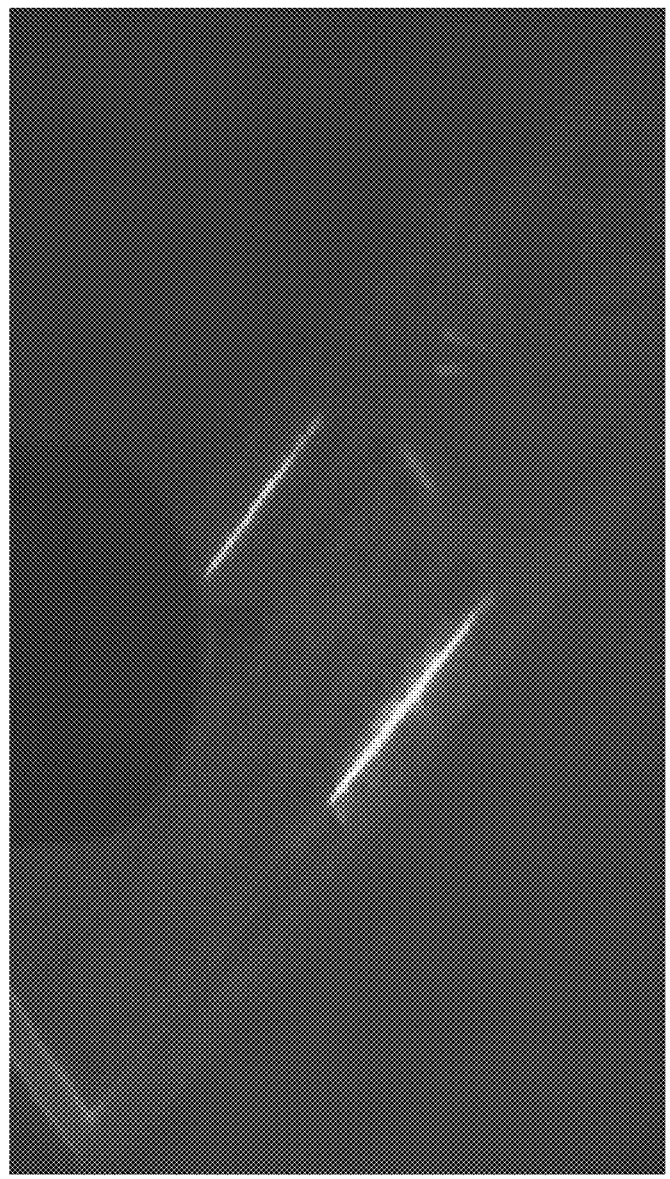
FIG. 7 is a photograph just after the measurement object of Example 2 was irradiated with charged particles.
Figure 8:
FIG. 8 is a photograph after a while since the measurement object of Example 2 was irradiated with the charged particles.

Then, as in Example 1, the measurement object was irradiated with charged particle by applying voltage/current (3 k, 1 µA) to an electrode located above (distance: 10 mm) to cause corona discharge. The results are shown in FIGS. 7 and 8. FIG. 7 is a photograph just after the measurement objectwas irradiated with charged particles, and FIG. 8 is a photograph after a while since the measurement object was irradiated with the charged particles.

As can be seen from these figures, portions of the electric conductivity-measuring film corresponding to the printed characters and the like momentarily emitted light along the characters and the like (emitted light as if the light was moving along the characters and the like) in a stage of starting irradiation with the charged particle, and other portions slowly began to emit light (emitted light as if the light was slowly moving) with the lapse of time, so that finally the whole electric conductivity-measuring film emitted light. In addition, the portions of the electric conductivity-measuring film corresponding to the characters and the like had higher light emission intensity than other portions.

From the above, it was found that, by irradiating the electric conductivity-measuring film with the charged particles to cause light emission, relative electric conductivity distribution of the measurement object could be grasped, and by measuring the moving speed of the portions that emit light (light-emitting portions), electric conductivity (electric conductivity distribution) of the surface of the measurement object corresponding to the light-emitting portion could be easily measured using calibration curves and the like.

Example 3

Figure 9:
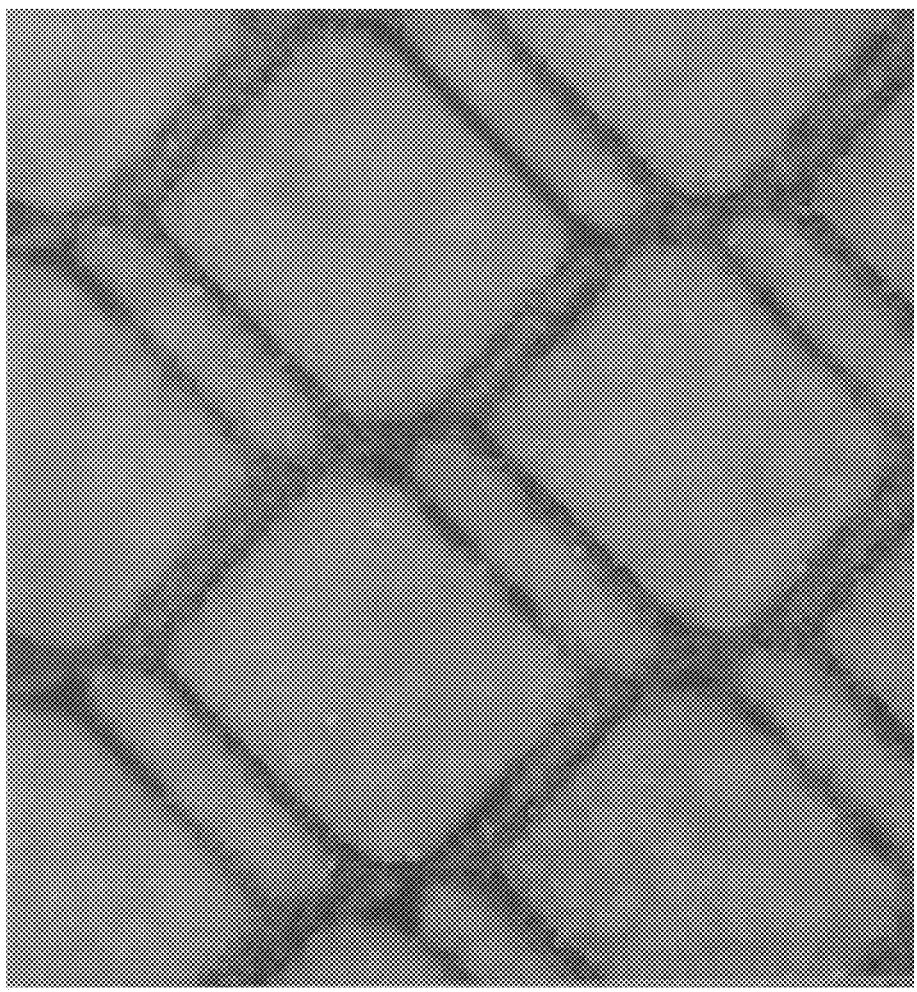
FIG. 9 is a photograph of a surface of an antistatic plastic sheet (measurement object) of Example 3.

An electric conductivity-measuring sheet as in Example 2 was placed on a surface of a measurement object, i.e., an antistatic plastic sheet (Achilles Seiden F (Both Sides Printed) from Achilles Corporation) shown in FIG. 9 which included conductive wires formed in a lattice shape in the vicinity of the both surface thereof. Here, the conductive wires have higher electric conductivity than plastic.

Figure 10:
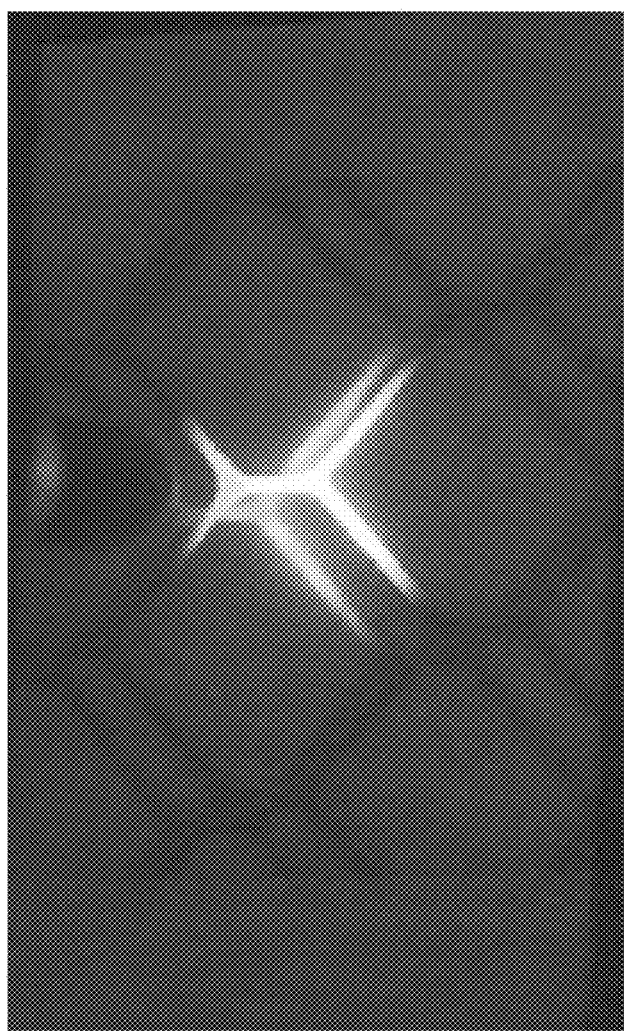
FIG. 10 is a photograph just after the measurement object of Example 3 was irradiated with charged particles.
Figure 11:
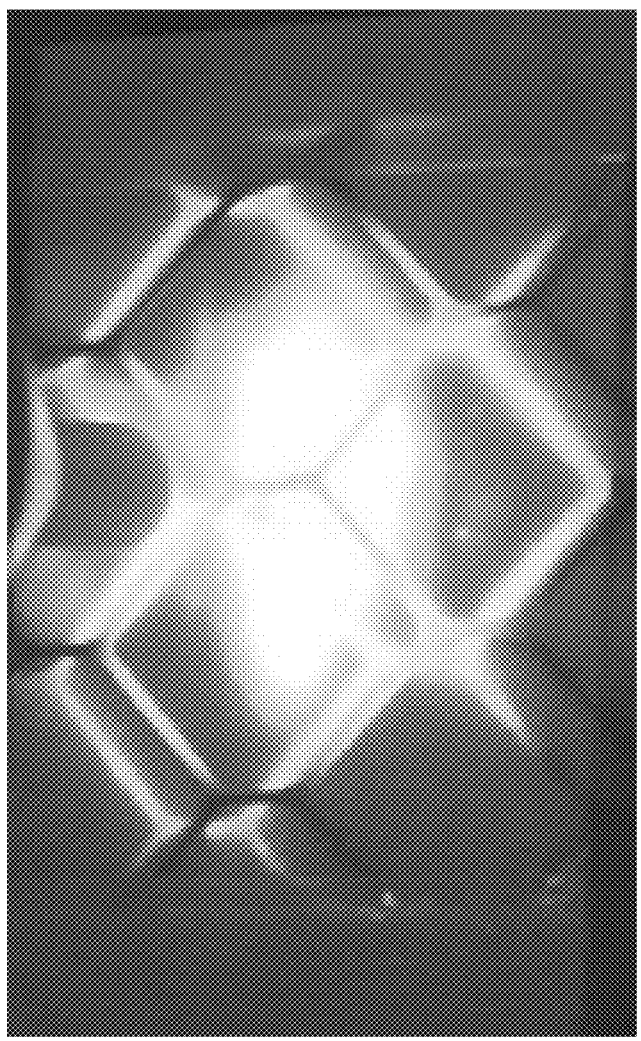
FIG. 11 is a photograph after a while since the measurement object of Example 3 was irradiated with the charged particles.

Then, as in Example 2, a central portion of the measurement object was irradiated with charged particle by applying DC voltage of 3 kV and 1 µA to an electrode located above (distance: 10 mm) to cause corona discharge. The results are shown in FIGS. 10 and 11.

As can be seen from these figures, portions of the electric conductivity-measuring film corresponding to the conductive wires near immediately below the voltage-applied electrode (including not only the conductive wires in the vicinity of the surface on which the electric conductivity-measuring film was formed, but also the conductive wires the conductive wires in the vicinity of the opposite surface (i.e., inside of the measurement object)) momentarily emitted light in a stage of starting irradiation with the charged particle, and portions of the electric conductivity-measuring film corresponding to other portions of the conductive wires (i.e., portions that had not emitted light in the stage of starting irradiation with the charged particle) quickly emitted light (emitted light as if the light was quickly moving) with the lapse of time. It was also found that portions corresponding to the plastic portions without the conductive wires slowly began to emit light (emitted light as if the light was slowly moving) with the further lapse of time. In addition, the portions of the electric conductivity-measuring film corresponding to the conductive wires had higher light emission intensity (luminance) than the plastic portions without the conductive wires.

Also from the above, it was found that, by irradiating the electric conductivity-measuring film with the charged particles to cause light emission, relative electric conductivity distribution of a surface and inside of the measurement object could be grasped, and by measuring the time to light emission and the moving speed of the portions that emit light (light-emitting portions), electric conductivity (electric conductivity distribution) of the surface of the measurement object corresponding to the light-emitting portion can be easily measured using calibration curves and the like.

Example 4

Figure 12:
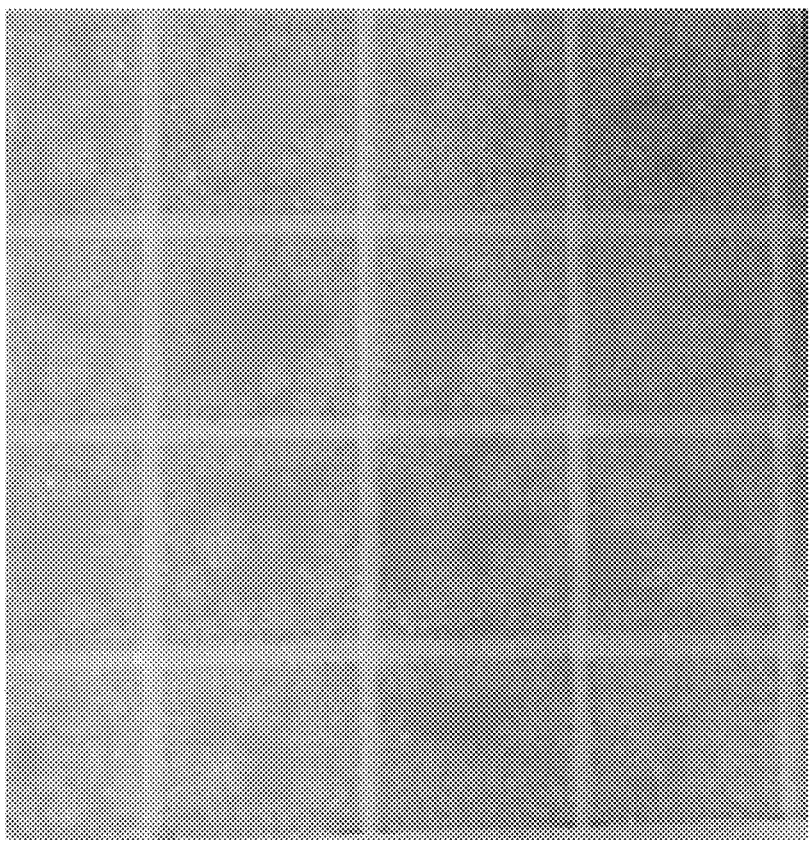
FIG. 12 is a photograph of a surface of an antistatic plastic sheet (measurement object) of Example 4.

An electric conductivity-measuring sheet as in Example 2 was placed on a surface of a measurement object, i.e., a Ply Canvas E-3000TFW (from Ishizuka Corporation. Inc.) shown in FIG. 12 on which a lattice-shaped mesh was formed. Here, polyester yarn constituting the mesh has higher electric conductivity than a transparent film made from polyvinylchloride.

Figure 13:
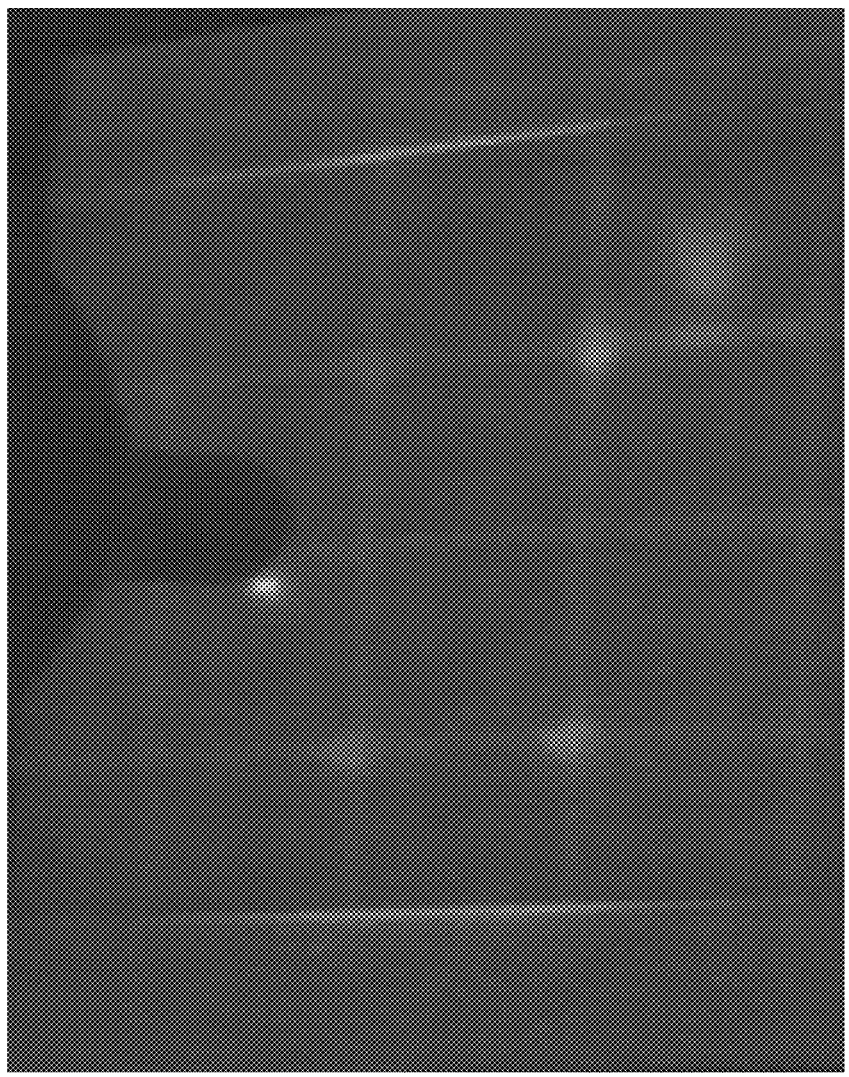
FIG. 13 is a photograph just after the measurement object of Example 4 was irradiated with charged particles.
Figure 14:
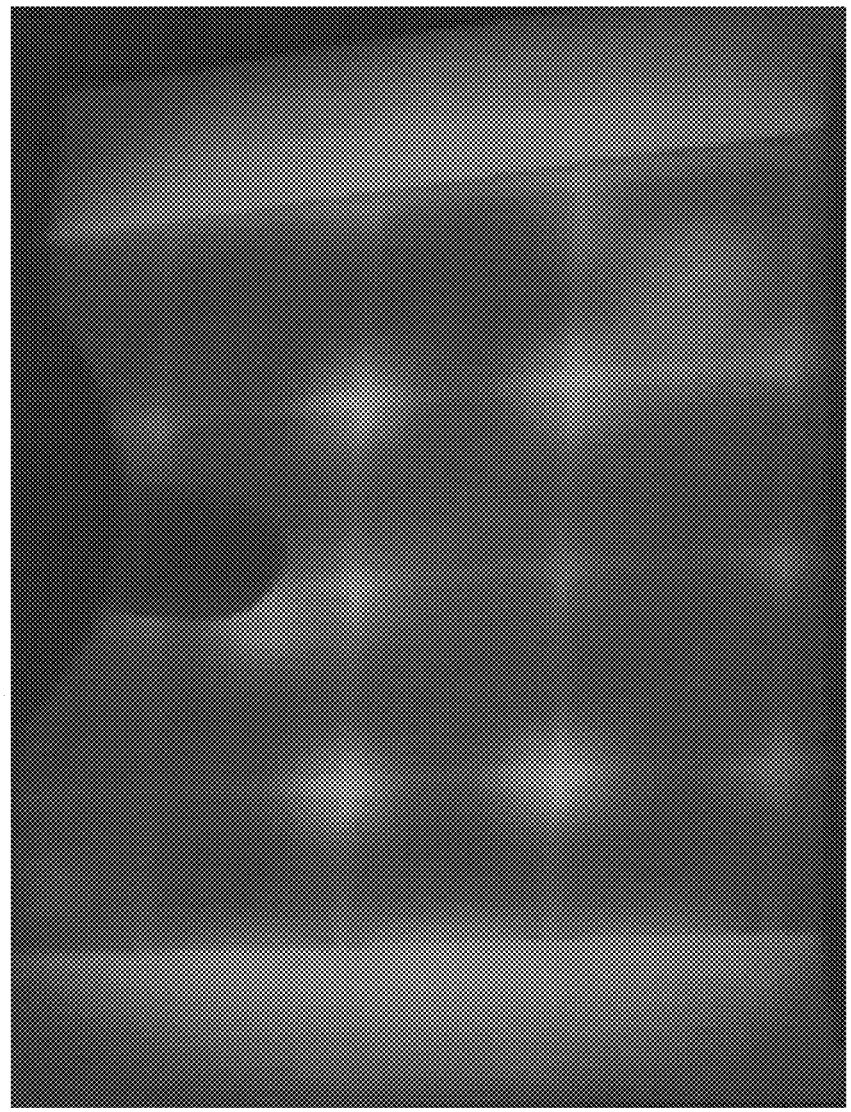
FIG. 14 is a photograph after a while since the measurement object of Example 4 was irradiated with the charged particles.

Then, as in Example 2, a portion of the measurement object was irradiated with charged particle by applying DC voltage of 3 kV and 1 µA to an electrode located above (distance: 10 mm) to cause corona discharge. The results are shown in FIGS. 13 and 14.

As can be seen from these figures, lattice-shaped portions of the electric conductivity-measuring sheet corresponding to the lattice-shaped mesh momentarily emitted light in a stage of starting irradiation with the charged particle, and portions of the electric conductivity-measuring sheet corresponding to other portions of the mesh (i.e., portions that had not emitted light in the stage of starting irradiation with the charged particle) quickly emitted light (emitted light as if the light was quickly moving) with the lapse of time. It was also found that portions corresponding to the transparent film without the mesh slowly began to emit light (emitted light as if the light was slowly moving) after the further lapse of time. In addition, the portions of the electric conductivity-measuring film corresponding to the mesh had higher light emission intensity (luminance) than the transparent film without the mesh.

Also from the above, it was found that, by irradiating the electric conductivity-measuring film with the charged particles to cause light emission, relative electric conductivity distribution of the measurement object could be grasped, and by measuring the time to light emission and the moving speed of the portions that emit light (light-emitting portions), electric conductivity (electric conductivity distribution) of the surface of the measurement object corresponding to the light-emitting portion could be easily measured using calibration curves and the like.

Example 5

Figure 15:
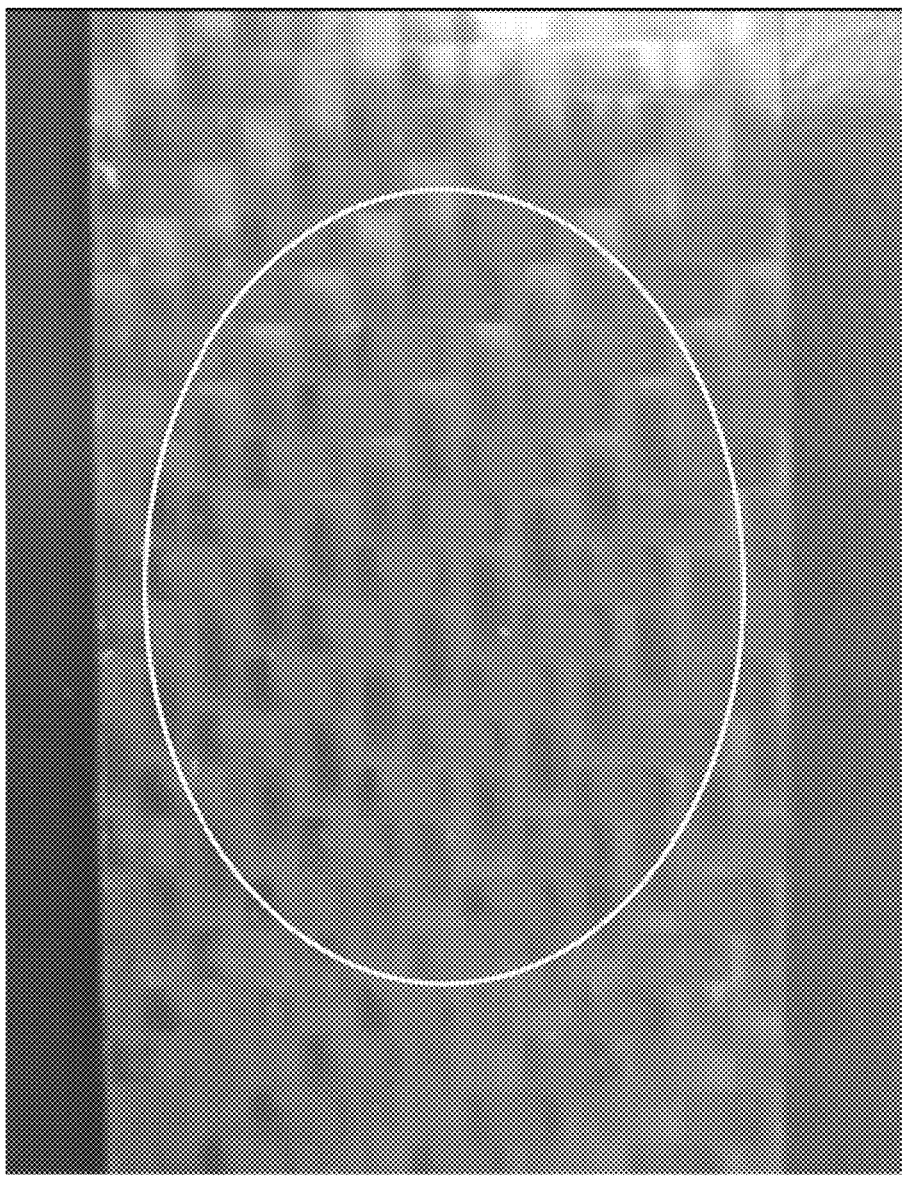
FIG. 15 is a photograph of a surface of a carbon fiber-reinforced plastic (measurement object) of Example 5.
Figure 16:
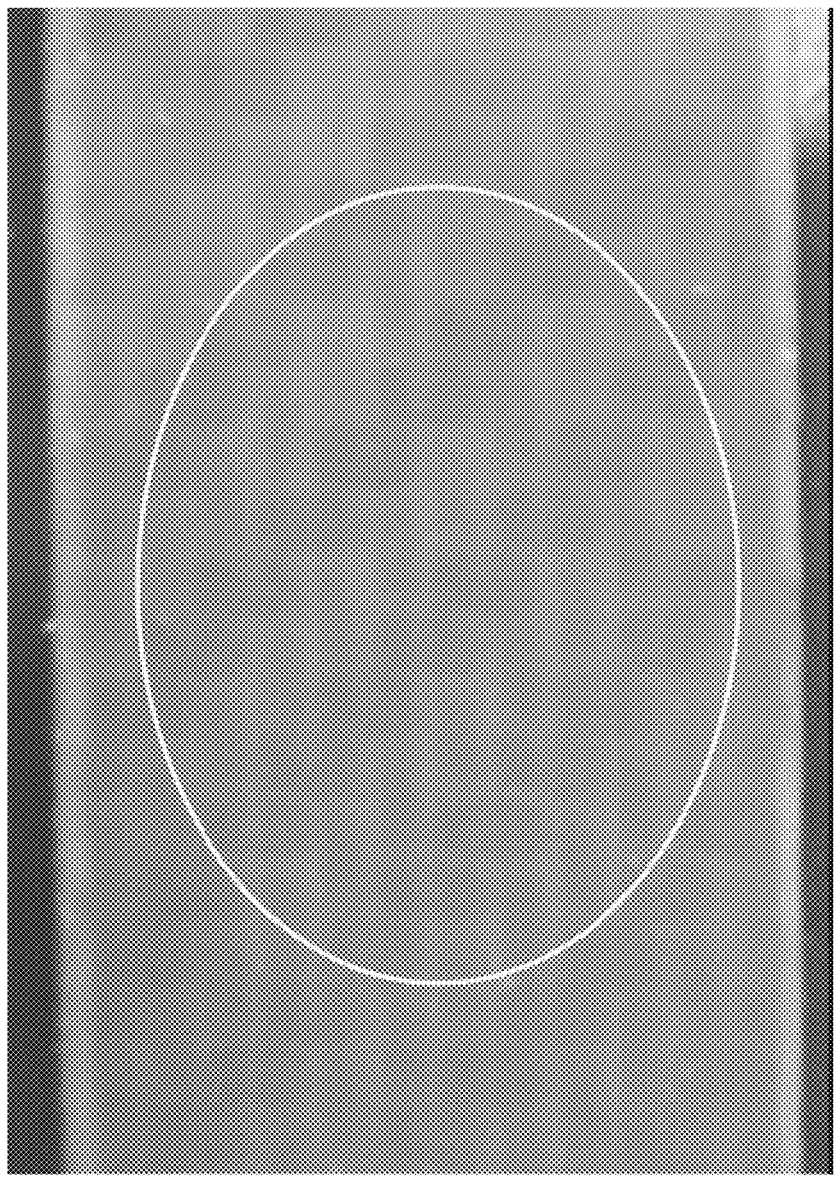
FIG. 16 is a photograph in which an electric conductivity-measuring film is pasted on the measurement object of Example 5.

A mechanoluminescent substance, i.e., a mixture of $SrAl_2O_4:Eu^{2+}$ and photocurable acrylic resin (from Microjet Corporation) (weight proportion of $SrAl_2O_4$:$Eu^{2+}$: 70%) was applied on a carbon fiber-reinforced plastic (CF/PA66, from Bond-Laminates) shown in FIG. 15 and cured so as to form an electric conductivity-measuring film (with a thickness of about 100 μm) shown in FIG. 16. Note that a portion enclosed by a circle is a portion to be irradiated with charged particles.

Here, a surface of the carbon fiber-reinforced plastic is made of an insulating material, and carbon fibers as a conducting material are kneaded into the inside thereof. Note that, among rectangular portions constituting the carbon fiber-reinforced plastic, portions having a vertically-arranged longitudinal direction have a configuration with higher electric conductivity than portions having a horizontally-arranged longitudinal direction.

Figure 17:
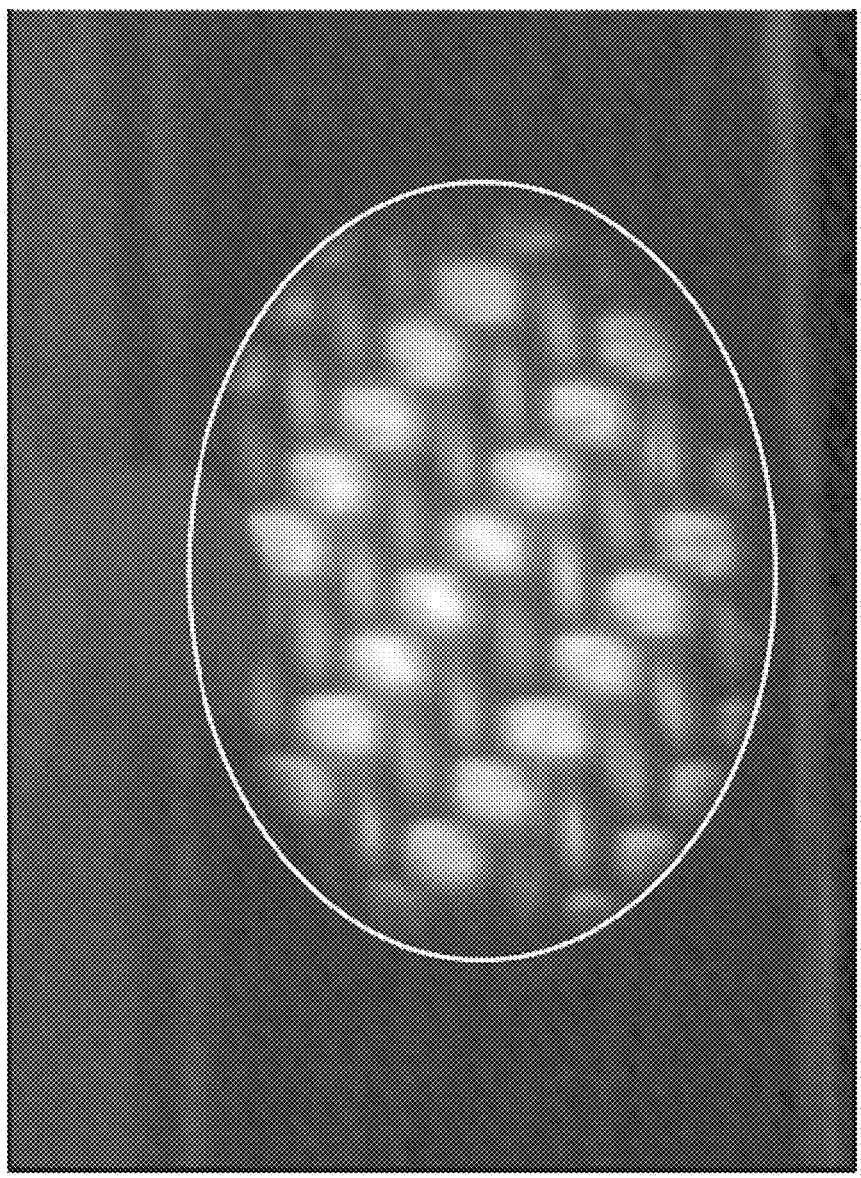
FIG. 17 is a photograph in which the measurement object of Example 5 is irradiated with charged particles.

Then, as in Example 2, a portion enclosed by a circle of the measurement object was irradiated with charged particle by applying DC voltage of 3 kV and 1 μA to an electrode located above (distance: 10 mm) to cause corona discharge. The result is shown in FIG. 17.

As can be seen from this figure, the portions into which carbon fibers were kneaded emitted light. It was found that, within this portion, an inner portion with higher electric conductivity emitted stronger light (light with higher luminance) than other portions.

Also from the above, it was found that, by irradiating the electric conductivity-measuring film with the charged particles to cause light emission, relative electric conductivity distribution of the inside of the measurement object could be easily measured.

Embodiment 2

In Embodiment 1, the measurement object provided with the electric conductivity-measuring film on its surface was irradiated with the charged particle from the charged particle-emitting unit located above to cause the light emission of the electric conductivity-measuring film, and thereby the electric conductivity (electric conductivity distribution) of the measurement object was measured. However, the present invention is not limited thereto.

For example, voltage may be directly applied to the measurement object including the electric conductivity-measuring film formed on its surface to cause the light emission of the electric conductivity-measuring film, and thereby the electric conductivity (electric conductivity distribution) of the measurement object may be measured.

Figure 18:
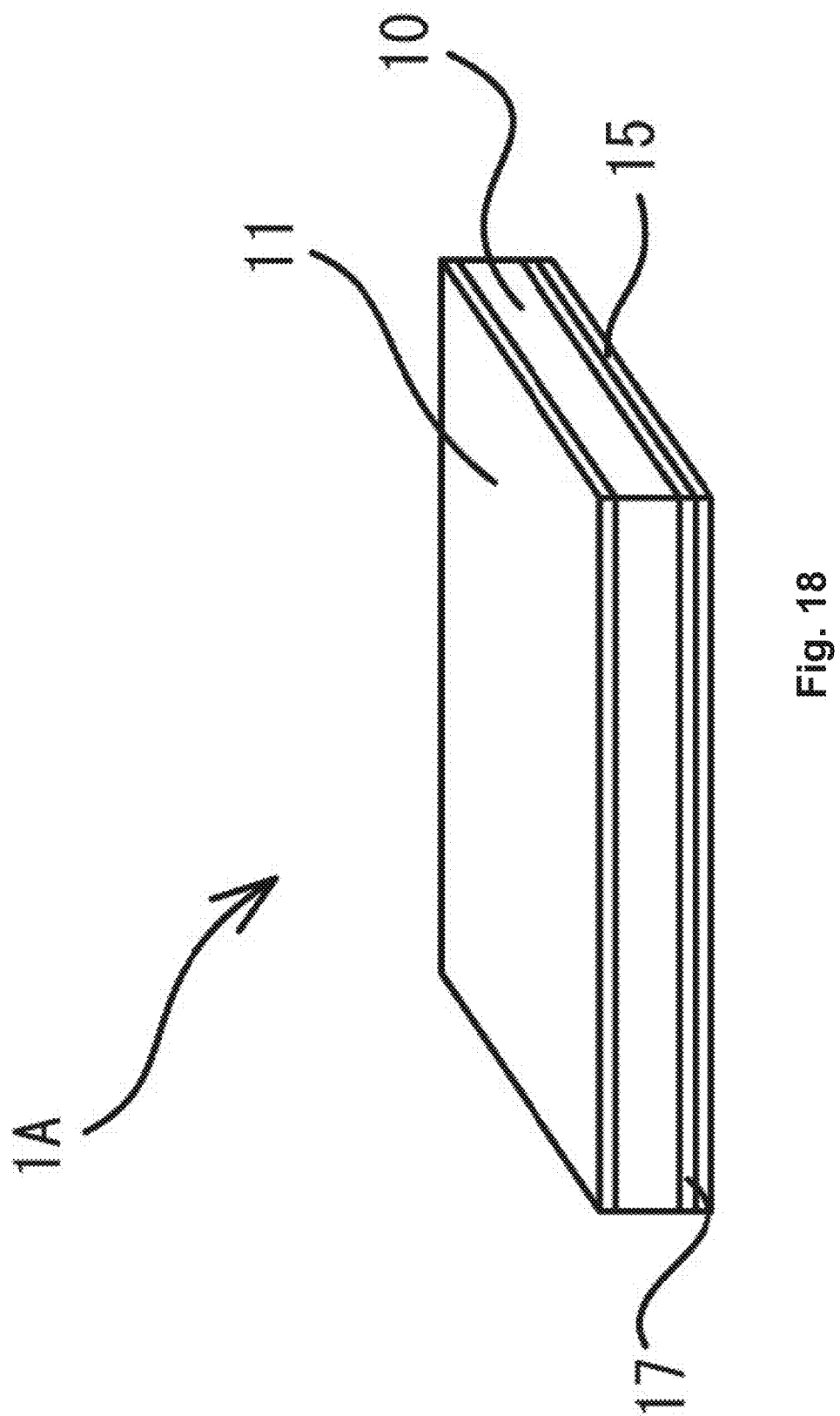
FIG. 18 is a schematic perspective view of an electric conductivity-measuring device according to Embodiment 2.

Specifically, as shown in FIG. 18, for a measurement object 10 including an electric conductivity-measuring film 11 formed on its one surface, an electrode 15 is provided over the other surface of the measurement object 10 via an insulating film 17. Note that the electrode 15 is connected to a power source (not shown). Also, in this embodiment, the electrode 15 and the power source constitute a voltage application means.

Here, the electrode 15 and the power source are not specifically limited as long as they can cause the light emission of the electric conductivity-measuring film 11 when voltage is applied thereto. A connecting position of the electrode to the measurement object 10 is also not specifically limited, and the electrode may be connected to the electric conductivity-measuring film 11. Furthermore, the voltage applied to the electrode 15 is also not specifically limited, and DC voltage, AC voltage, pulse voltage, and the like can be used. In addition, the insulating film 17 is also specifically limited as long as it can prevent the movement of charge from the electrode 15 to the measurement object 10.

Then, as in Embodiment 1, the electric conductivity-measuring film emits light corresponding to electric conductivity distribution of the surface or inside of the measurement object 10 when voltage is applied to the electrode 15. Also, luminance of the electric conductivity-measuring film which emits light at this time is increased according to the magnitude of the electric conductivity of the measurement object in the vicinity thereof.

Therefore, as in Embodiment 1, local electric conductivity (electric conductivity distribution) of the measurement object 10 can be measured, and by measuring the moving speed of the light-emitting portions, electric conductivity (electric conductivity distribution) of the surface of the measurement object 10 corresponding to the light-emitting portion can be easily measured.

Also, although the voltage application means is constituted by the electrode 15 and the power source, the voltage application means is not specifically limited as long as it can apply voltage to the measurement object 10. For other voltage application means: the power source may be directly connected to the measurement object so that the charged particle-emitting unit described in Embodiment 1 is in contact with the measurement object; or voltage may applied to the measurement object due to contact charging, peeling charging, friction charging, or the like.

Note that the electric conductivity is the reciprocal of the, electric resistivity. Therefore, when the electric conductivity-measuring film 11 of this embodiment is replaced by an electric resistivity-measuring film, electric resistivity (electric resistivity distribution) of the measurement object 10 can also be measured using calibration curves and the like in a similar manner to Embodiment 1.

Other Embodiments

In the aforementioned embodiments, a solid was used as the measurement object. However, the measurement object to which the present invention can be applied is not limited thereto. The present invention can be applied to substances other than solid substances such as liquids and gel substances as the measurement object.

Note that, although the camera as the recording unit was installed so as to record the luminescence state of the electric conductivity-measuring film in the aforementioned embodiments, it is needless to say that the luminescence state of the electric conductivity-measuring film can be observed with naked eyes without installing a camera.

REFERENCE NUMERALS 1, 1A electric conductivity-measuring device
10 measurement object
11 electric conductivity-measuring film
15, 55 electrode
17 insulating film
20 charged particle-emitting unit
50 PLA sheet
51 silver nanoink line
53 electric conductivity-measuring sheet

The invention claimed is:
1. An electric conductivity-measuring method for measuring electric conductivity of a surface or inside of a measurement object by measuring light emission from the surface of the measurement object, comprising steps of:

forming the electric conductivity-measuring film containing at least one of a fluorescent substance, a luminescent substance, an electroluminescent substance, a fractoluminescent substance, a photochromic substance, an afterglow substance, a photostimulated luminescent substance and a mechanoluminescent substance on the surface of the measurement object; and emitting charged particles toward the electric conductivity-measuring film;

wherein volume resistivity or surface resistivity of the electric conductivity-measuring film is higher than volume resistivity or surface resistivity of the measurement object.

2. An electric conductivity-measuring method for measuring electric conductivity of a surface or inside of a measurement object by measuring light emission from the surface of the measurement object, comprising steps of:

forming the electric conductivity-measuring film containing at least one of a fluorescent substance, a luminescent substance, an electroluminescent substance, a fractoluminescent substance, a photochromic substance, an afterglow substance, a photostimulated luminescent substance and a mechanoluminescent substance on the surface of the measurement object; and emitting charged particles toward the electric conductivity-measuring film;

wherein the mechanoluminescent substance is: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

3. An electric conductivity-measuring method for measuring electric conductivity of a surface or inside of a measurement object by measuring light emission from the surface of the measurement object, comprising steps of:

forming the electric conductivity-measuring film containing at least one of a fluorescent substance, a luminescent substance, an electroluminescent substance, a fractoluminescent substance, a photochromic substance, an afterglow substance, a photostimulated luminescent substance and a mechanoluminescent substance on the surface of the measurement object;

emitting charged particles toward the electric conductivity-measuring film, wherein the charged particles have an energy ranging from 1 V/mm to 3000 V/mm; and applying voltage to the measurement object.

4. The electric conductivity-measuring method according to claim 3, wherein volume resistivity or surface resistivity of the electric conductivity-measuring film is higher than volume resistivity or surface resistivity of the measurement object.

5. The electric conductivity-measuring method according to claim 4, wherein the mechanoluminescent substance is: a substance represented by $SrAl_2O_4$ which is doped with $Eu^{2+}$; a substance represented by $SrAl_2O_4$ which is doped with at least one of $Eu^{2+}$, $Ho^{3+}$, $Dy^{2+}$, $M_1$, $M_2$ and $M_3$ ($M_1$, $M_2$, $M_3$=monovalent to trivalent metal ions different from each other); or a substance represented by $CaYAl_3O_7$ which is doped with $Eu^{2+}$.

6. The electric conductivity-measuring method according to claim 1, wherein the charged particles have an energy ranging from 1 V/mm to 3000 V/mm.

* * * * *